United States Patent
Morich et al.

(10) Patent No.: US 6,278,276 B1
(45) Date of Patent: Aug. 21, 2001

(54) PHASED ARRAY GRADIENT COIL SET WITH AN OFF CENTER GRADIENT FIELD SWEET SPOT

(75) Inventors: Michael A. Morich, Mentor; Labros S. Retropoulos, Solon, both of OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/441,283

(22) Filed: Nov. 16, 1999

(51) Int. Cl.[7] ....................................... G01V 3/00
(52) U.S. Cl. .............................. 324/318; 324/322
(58) Field of Search ................................ 324/318, 322, 324/300, 306, 307, 309; 600/421, 422

(56) References Cited

U.S. PATENT DOCUMENTS

| | | | |
|---|---|---|---|
| 4,794,338 | 12/1988 | Roemer et al. | 324/39 |
| 5,132,618 | 7/1992 | Sugimoto | 324/318 |
| 5,235,279 | * 8/1993 | Kaufman et al. | 324/309 |
| 5,278,504 | 1/1994 | Patrick et al. | 324/318 |
| 5,296,810 | 3/1994 | Morich | 324/318 |
| 5,736,858 | 4/1998 | Katznelson et al. | 324/318 |
| 5,942,898 | 8/1999 | Petropoulos et al. | 324/318 |
| 5,952,830 | 9/1999 | Petropoulos et al. | 324/318 |

* cited by examiner

Primary Examiner—Louis Arana
(74) Attorney, Agent, or Firm—Fay, Sharpe, Fagan, Minnion & McKee, LLP

(57) ABSTRACT

A gradient coil assembly (22) generates substantially linear gradient magnetic fields through an examination region (14). The gradient coil assembly (22) includes a pair of primary gradient coil sets (22a, 22b) and a pair of shield coil sets (23a, 23b) which are disposed in an overlapping relationship. One gradient coil set is displaced relative to the other gradient coil set such that the mutual inductance between the two is minimized. Preferably, the coil sets (22a, 22b, 23a, 23b) are asymmetric, such that the sweet spot of each coil is displaced from the geometric center of each coil. One primary gradient coil set (22a) is a high efficiency, high switching speed coil to enhance performance of ultrafast magnetic resonance sequences, while the second primary gradient coil set (22b) is a low efficiency coil which generates a high quality gradient magnetic field, but with slower switching speeds. By displacing one gradient coil set relative to the other, mutual inductance is minimized, which maximizes peak gradient, rise time, and slew rate, while dB/dt levels are minimized. Arranging asymmetric gradient coil sets in an overlapping, phased array reduces coil resistance, which increases duty cycle and reduces heat dissipation to eliminate extra costs for a cooling system.

26 Claims, 11 Drawing Sheets

PHASED ARRAY GRADIENT COIL SET WITH AN OFF CENTER GRADIENT FIELD SWEET SPOT

BACKGROUND OF THE INVENTION

The present invention relates to the magnetic resonance arts. It finds particular application in conjunction with gradient coils for a magnetic resonance imaging apparatus and will be described with particular reference thereto. However, it is to be appreciated that the present invention will also find application in conjunction with localized magnetic resonance spectroscopy systems and other applications which utilize gradient magnetic fields.

In magnetic resonance imaging, a uniform magnetic field is created through an examination region in which a subject to be examined is disposed. A series of radio frequency pulses and magnetic field gradients are applied to the examination region. Gradient fields are conventionally applied as a series of gradient pulses with pre-selected profiles. The radio frequency pulses excite magnetic resonance and the gradient field pulses phase and frequency encode the induced resonance. In this manner, phase and frequency encoded magnetic resonance signals are generated.

More specifically, the gradient magnetic field pulses are typically applied to select and encode the magnetic resonance with spatial position. In some embodiments, the magnetic field gradients are applied to select a slice or slab to be imaged. Ideally, the phase or frequency encoding uniquely identifies spatial location.

In bore type magnets, linear magnetic field gradients are commonly produced by cylindrical gradient field coils wound on and around a cylindrical former. Discrete coils are wound in a bunched or distributed fashion on a large diameter cylindrical tube, commonly 30 centimeters in diameter or larger.

Historically, gradient coil designs were developed in a "forward approach," whereby a set of initial coil positions were defined and the fields, energy, and inductance calculated. If these quantities were not within the particular design criteria, the coil positions were shifted (statistically or otherwise) and the results re-evaluated. This iterative procedure continued until a suitable design was obtained.

Recently, gradient coils are designed using the "inverse approach," whereby gradient fields are forced to match predetermined values at specified spatial locations inside the imaging volume. Then, a continuous current density is generated which is capable of producing such fields. This approach is adequate for designing non-shielded or actively shielded gradient coil sets.

When designing gradient coils for magnetic resonance imaging, many opposing factors must be considered. Typically, there is a trade off between gradient speed and image quality factors such as volume, uniformity, and linearity. Some magnetic resonance sequences require a gradient coil which emphasizes efficiency, while other sequences are best with a gradient coil which emphasizes image quality factors. For example, a gradient coil which has a large linear imaging volume is advantageous for spine imaging, but is disadvantageous in terms of the dB/dt when switched with a high slew rate.

U.S. Pat. No. 5,736,858 to Katznelson, et al. discloses a magnetic resonance imaging system which has two permanently mounted gradient coil sets where trade offs between linearity and coil performance are taken into account. The gradient coil sets are symmetric coil sets (where the gradient field's sweet spot and the gradient coil's geometric center coincide) which consist of twelve gradient coils (six primary gradient coils and six shield coils). The imaging volume and the performance levels of the two symmetric coils are different. Further, both primary gradient coil sets have different lengths. Specifically, the primary and shield coil combination with better linearity, lower efficiency, and the larger imaging volume is longer than the primary and shield coil combination which has higher efficiency, lower field quality, and a smaller imaging volume. While this design, employing symmetric coils, accounts for some trade offs between efficiency and gradient field quality, it is still problematic.

For very short gradient lengths, the current density of the high efficiency coil increases significantly. The increased current density leads to an increase in the coil's resistance and a shortening of the coil's duty cycle at peak gradient. In this configuration, an extensive cooling scheme, utilizing a multi-layer cooling tube assembly which is difficult to implement, is required. In addition, overlapping of the two symmetric coil sets leads to a significant interaction between them which is measured by the mutual inductance of the coil sets. The mutual inductance of the two coil sets prevents all available power from the amplifier from being directed to the operating modular gradient structure. This reduces the gradient assembly's peak gradient, rise time, and overall slew rate.

The present invention contemplates a new and improved gradient coil set which overcomes the above-referenced problems and others.

SUMMARY OF THE INVENTION

In accordance with one aspect of the present invention, a magnetic resonance imaging apparatus includes a main magnet for generating a main magnetic field through and surrounding an examination region. A gradient coil assembly generates gradient magnetic fields across the examination region. The gradient coil assembly includes at least a first primary gradient coil set and a second primary gradient coil set which are disposed in an overlapping relationship. The first primary gradient coil set is at least one of axially and radially displaced relative to the second primary gradient coil set such that mutual inductance between the two gradient coil sets is minimized. An RF transmitter and coil assembly positioned adjacent the examination region excites magnetic resonance dipoles in and adjacent the examination region. An RF coil and receiver assembly receives and demodulates magnetic resonance signals from the resonating dipoles. A reconstruction processor reconstructs the demodulated magnetic resonance signals into an image representation.

In accordance with a more limited aspect of the present invention, the gradient coil assembly includes at least one shielding coil set. The shielding coil set includes an array of conductive loops such that a current density flowing thereon causes a magnetic flux density which interacts with a magnetic flux density generated by the first and second primary gradient magnetic fields to substantially zero a net magnetization flux density outside an area defined by the shielding coil set.

In accordance with another aspect of the present invention, a method of designing a phased array gradient coil assembly for a magnetic resonance imaging system includes selecting geometric configurations for a primary coil set having a corresponding shield coil set and a second primary coil set having a corresponding second shield coil set. The method further includes generating first and second continuous current distributions for the first primary and shield coil sets and third and fourth continuous current distributions for the second primary and shield coil sets. The first primary coil set is optimized with the first shield coil set using an energy/inductance minimization algorithm. Next, the second primary coil set is optimized with the second shield coil set using an energy/inductance minimization algorithm. Eddy currents are evaluated within the prescribed imaging volume for both the first and second primary coil sets and at least one characteristic of the geometric configurations defined above are modified if the eddy currents do not meet specified target values. The first primary and shield coil sets and the second primary and shield coil sets are discretized. The first primary coil set is at least one of axially and radially displaced relative to the second primary coil set such that mutual inductance between the two is minimized.

In accordance with another aspect of the present invention, a phased array gradient coil assembly for generating magnetic gradients across a main magnetic field of a magnetic resonance apparatus includes a first primary coil set and a second primary coil set each including first and second x, y, and z-gradient coils having sweet spots in which the magnetic field generated is substantially linear. The respective sweet spots are coincident with an examination region. The first and second primary coil sets are disposed in an overlapping relationship with the first primary coil set being at least one of axially and radially displaced relative to the second primary coil set such that the mutual inductance between the two is minimized. The gradient coil assembly further includes at least one shielding coil set outside the first and second primary coil sets for generating a magnetic field to substantially zero magnetic field gradients outside the shielding coil set.

One advantage of the present invention is that it reduces the resistance of the gradient coil assembly.

Another advantage of the present invention is that it increases the duty cycle of the gradient coil assembly.

Another advantage of the present invention is that it minimizes mutual inductance of the gradient coil assembly.

Another advantage of the present invention is that it reduces the cost of manufacturing.

Yet another advantage of the present invention is that it reduces dB/dt levels.

Another advantage of the present invention is that it minimizes torque and thrust forces.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
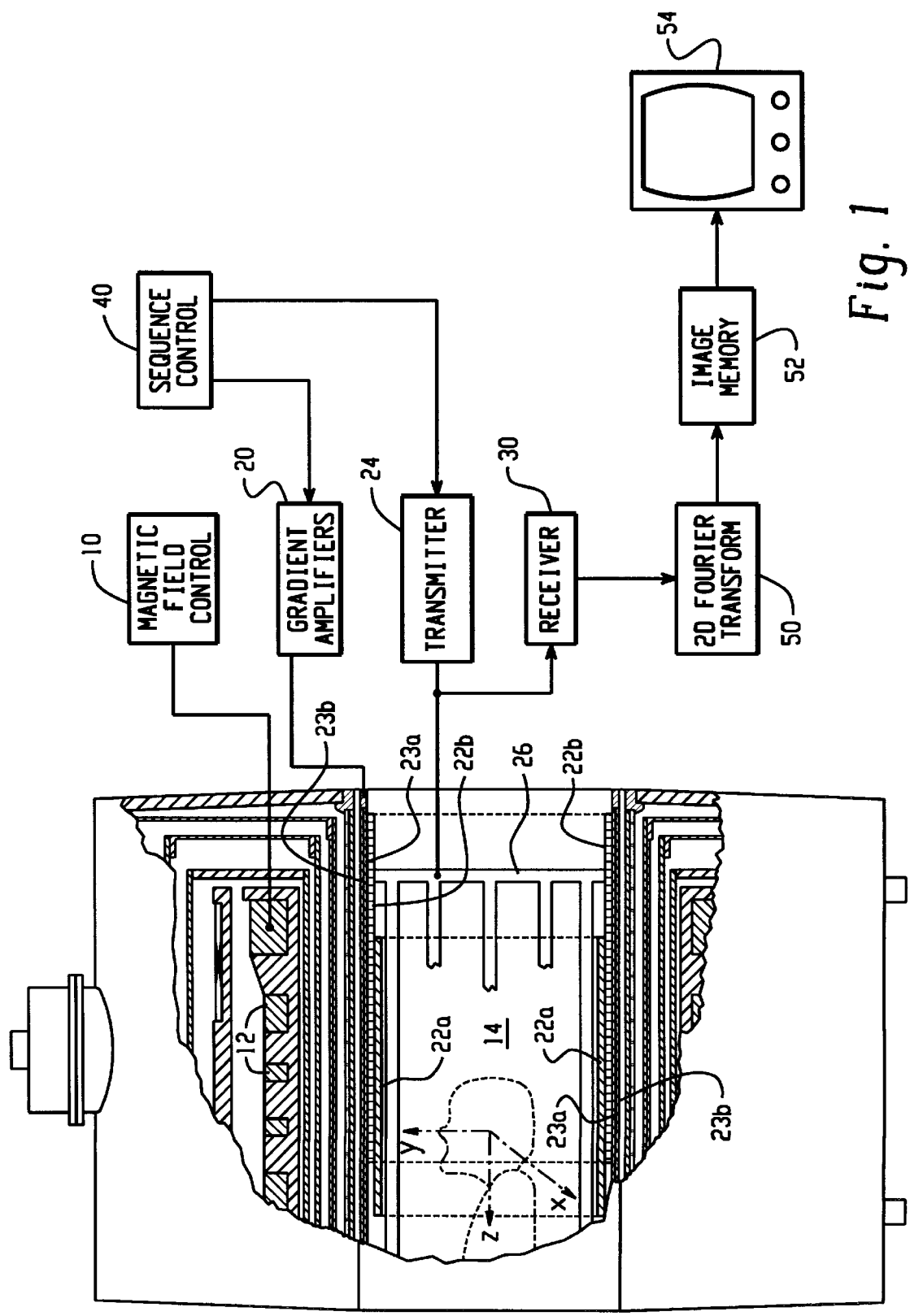
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant main magnetic field is created along a z axis through an examination region 14. Although a bore-type magnet is illustrated in FIG. 1, it is to be appreciated that the present invention is equally applicable to open field magnetic systems with vertically directed fields. A couch (not illustrated) suspends a subject to be examined within the examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to a gradient coil assembly 22 that includes a pair of primary gradient coil sets 22a, 22b and a pair of shield gradient coil sets 23a, 23b to create magnetic field gradients along x, y, and z axes of the examination region 14 with zero or minimal fringe fields outside of the bore. A digital radio frequency transmitter 24 transmits radio frequency pulses or pulse packets to a whole-body RF coil 26 to transmit RF pulses into the examination region 14. A typical radio frequency pulse is composed of a packet of immediately contiguous pulse segments of short duration which, taken together with each other and any applied gradients, achieve a selected magnetic resonance manipulation. For whole-body applications, the resonance signals are commonly picked up by the whole-body RF coil 26, but may be picked up by other specialized RF coils.

For generating images of local regions of the subject, specialized radio frequency coils are placed contiguous to the selected region. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used only to receive resonance signals introduced by whole-body RF coil transmissions. The resultant radio frequency signals are picked up by the whole-body RF coil 26, the insertable RF coil, or other specialized RF coils and demodulated by a receiver 30, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For the selected sequence, the receiver 30 receives a plurality of data lines in rapid succession following each RF excitation pulse. Ultimately, the radio frequency signals received are demodulated and reconstructed into an image representation by a reconstruction processor 50 which applies a two-dimensional Fourier transform or other appropriate reconstruction algorithm. The image is then stored in an image memory 52. A human-readable display 54, such as a video monitor, provides a human-readable display of the resultant image. The image may represent a planar slice through the patient, an array of parallel planar slices, a three-dimensional volume, or the like.

Figure 2A:
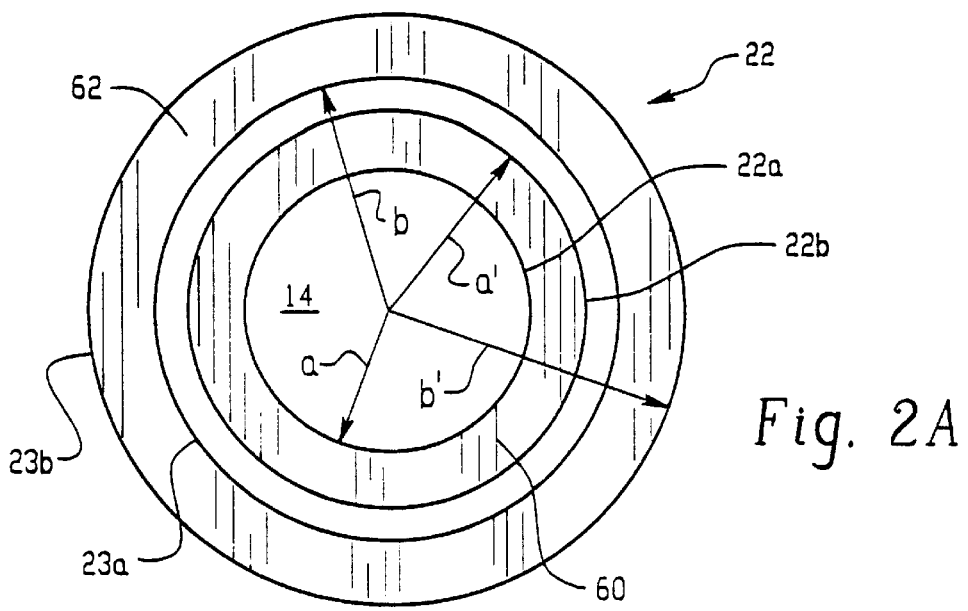
FIG. 2A is a diagrammatic illustration of a cross-section of the gradient coil assembly in accordance with the present invention.

With reference to FIG. 2A and continuing reference to FIG. 1, the gradient coil assembly preferably includes a pair of primary gradient coil sets 22a, 22b and a corresponding pair of shield coil sets 23a, 23b. In one embodiment, both primary gradient coil sets 22a, 22b are mounted on a first former 60, while both shield coil sets 23a, 23b are mounted on a second former 62. The first primary gradient coil set 22a is mounted on an inner surface of the first former 60 and has a radius a, while the second primary gradient coil set 22b is mounted on the outer surface of the first former 60 and has a radius a'. The first former 60 defines the examination region 14 for receiving a portion of the subject to be examined. The first shield coil set 23a is mounted on an inner surface of the second former 62 and has a radius b, while the second shield coil set 23b is mounted on an outer surface of the second former 62 and has a radius b'. Alternately, both primary gradient coil sets and both corresponding shield coil sets may be mounted on a single former with spacers therebetween (not shown in FIG. 2A).

Figure 2B:
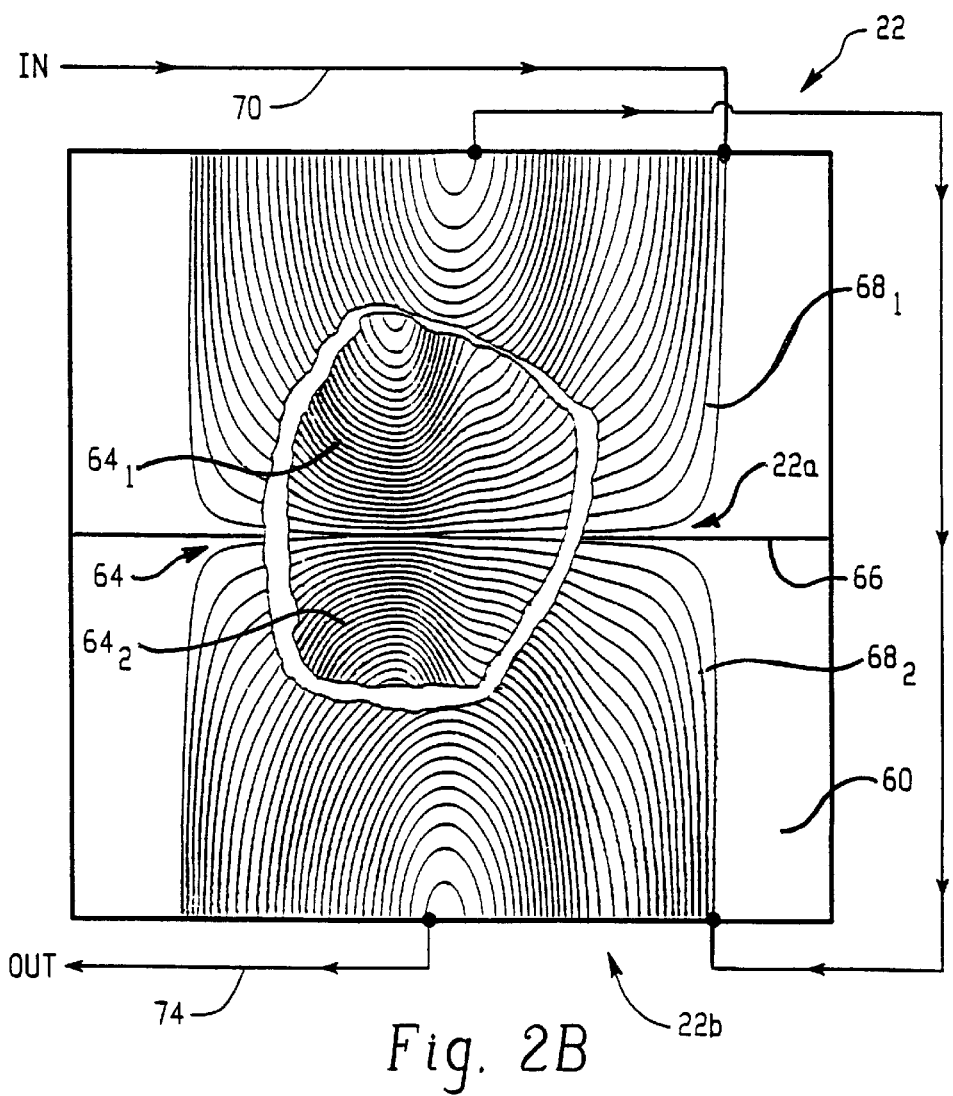
FIG. 2B is a perspective view of overlapping primary gradient coil sets in accordance with the present invention.

With reference to FIG. 2B and continuing reference to FIGS. 2A and 1, the gradient coil assembly 22 preferably consists of a pair of primary gradient coil sets 22a, 22b on a former 60 which are disposed in an overlapping relationship (corresponding shield coil sets not shown in FIG. 2B). Preferably, the primary gradient coil sets are asymmetric, i.e. each coil set's "sweet spot" (region where the gradient magnetic field is substantially linear) is displaced axially from the geometric center of the gradient coil set and toward one of its two ends. It is to be appreciated that the present invention may contain two asymmetric gradient coil sets, two symmetric gradient coil sets, and one asymmetric gradient coil set with one symmetric gradient coil set. In addition, it is to be appreciated that more than two primary gradient coil sets may be overlapped in a phased array relationship. Further, it is to be appreciated that there is no requirement that the sweet spots of the respective gradient coil sets coincide.

As shown in FIG. 2B, the first primary gradient coil set 22a is displaced axially or radially with respect to the second primary gradient coil set 22b. The axial and/or radial displacement of one primary gradient coil set relative to the other is determined by a mutual inductance minimization algorithm, which will be discussed in full detail below. By displacing one gradient coil set relative to another gradient coil set, the mutual inductance or interaction between the two is minimized. This feature maximizes peak gradient, rise time, and slew rate and leads to overall greater coil efficiency. Further, the use of asymmetric gradient coils in the inductance minimizing configuration lowers the coil's resistance and increases the duty cycle of the coil. With asymmetric coils, the entire length of the coil is utilized which controls the current density by allowing it to be distributed with wider copper loops for lower resistance and reduced heat dissipation. As a result, no elaborate cooling system is required.

Preferably, the first primary gradient coil set is a high efficiency coil set which enhances performance of ultrafast magnetic resonance sequences. Such a coil set minimizes dB/dt levels and eddy current effects. Preferably, the second primary gradient coil set is a low efficiency coil set capable of generating a high quality gradient field. Such a coil set typically is ideal for imaging applications with inherently low dB/dt and eddy current levels.

Figure 4A:
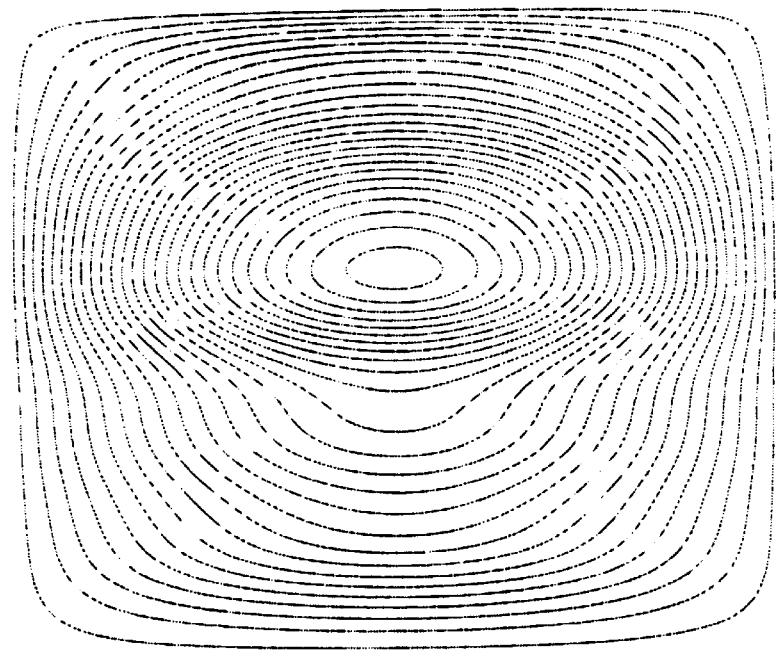
FIGS. 4A and 4B are diagrammatic illustrations of an exemplary first primary asymmetric x-gradient coil and a first shield coil in accordance with the present invention.

With continuing reference to FIG. 2B, two x-gradient coils 64 of a pattern determined by the below-referenced design procedure are laminated to the inner cylindrical surface of the former 60. More specifically, for the x-gradient coil, the coil winding $64_1$ of FIG. 4A is connected with a like coil winding $64_2$. The pair of winding assemblies $64_1$, $64_2$ are laminated with edge 66 at the longitudinal center of the former 60 and extending peripherally therearound the inner surface. The y-gradient coils (not shown) are mounted to the former 60 but 90 degrees rotated relative to the x-gradient coils. A primary z-gradient coil is constructed of a conductive material, such as copper foil or wire. The z-gradient coil is preferably wound into grooves in the former 60 and potted in an epoxy.

Figure 5A:
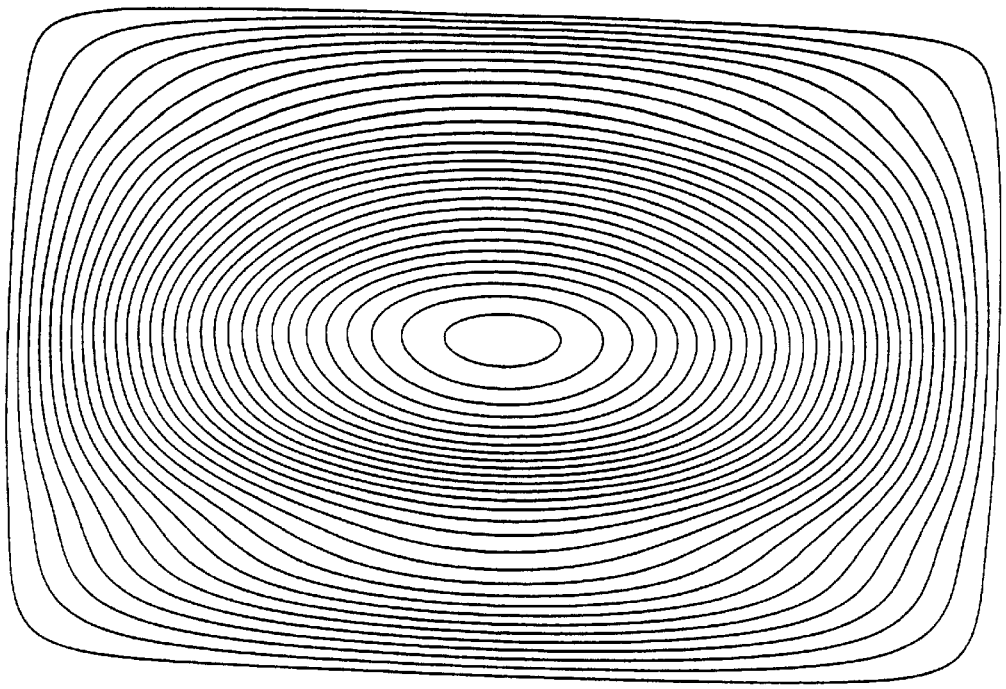
FIGS. 5A and 5B are diagrammatic illustrations of an exemplary second primary asymmetric x-gradient coil and a second shield coil in accordance with the present invention.

The second primary gradient coil set 22b includes two x-gradient coils 68 of a pattern determined by the below-referenced design procedure are laminated to the outer cylindrical surface of the former 60. Alternately, the second x-gradient coils are laminated to the first x-gradient coils on the inner surface of the former. In one embodiment, x-gradient coil winding $68_1$ of FIG. 5A is connected with a like coil winding $68_2$ as shown in FIG. 2B. Current flows into one x-gradient coil $68_1$ along line 70. The current flows out of x-gradient coil $68_1$ along line 72 and into x-gradient coil $68_2$. The current flows through x-gradient coil $68_2$ and out along line 74. The pair of winding assemblies $68_1$, $68_2$ are laminated with edge 66 at the longitudinal center of the former 60 and extending peripherally therearound. The y-gradient coils (not shown) are mounted to the former 60 but 90 degrees rotated relative to the x-gradient coils. A primary z-gradient coil is constructed of a conductive material, such as copper foil or wire. The z-gradient coil is preferably wound into grooves in the former 60 and potted in an epoxy. For both the first and second primary gradient coil sets 22a, 22b, the x and y-gradient coils are electrically insulated form each other and preferably potted in an epoxy. The windings are preferably manufactured from a relatively thin conductive sheet, such as copper. The sheet is preferably cut before lamination to the former by water jet cutting, laser cutting, etching or the like, and then bonded to a thin insulating substrate, minimizing radial thickness.

The theoretical development, the design procedure and the numerical results for two asymmetric, shielded gradient coil sets, each consisting of three gradients coils, is now discussed. In addition, the theoretical development and numerical results for two sets of actively shielded asymmetric gradient coils with minimized mutual inductance is discussed. Specifically, the theoretical development, the design, and the results of a gradient coil where the z component of the magnetic field varies linearly along the transverse direction (x, y-gradient coil), as well as, the axial gradient coil (z-gradient coil) will be presented. The x-gradient coil will be presented in its entirety as a representative for the transverse coils.

Figure 3:
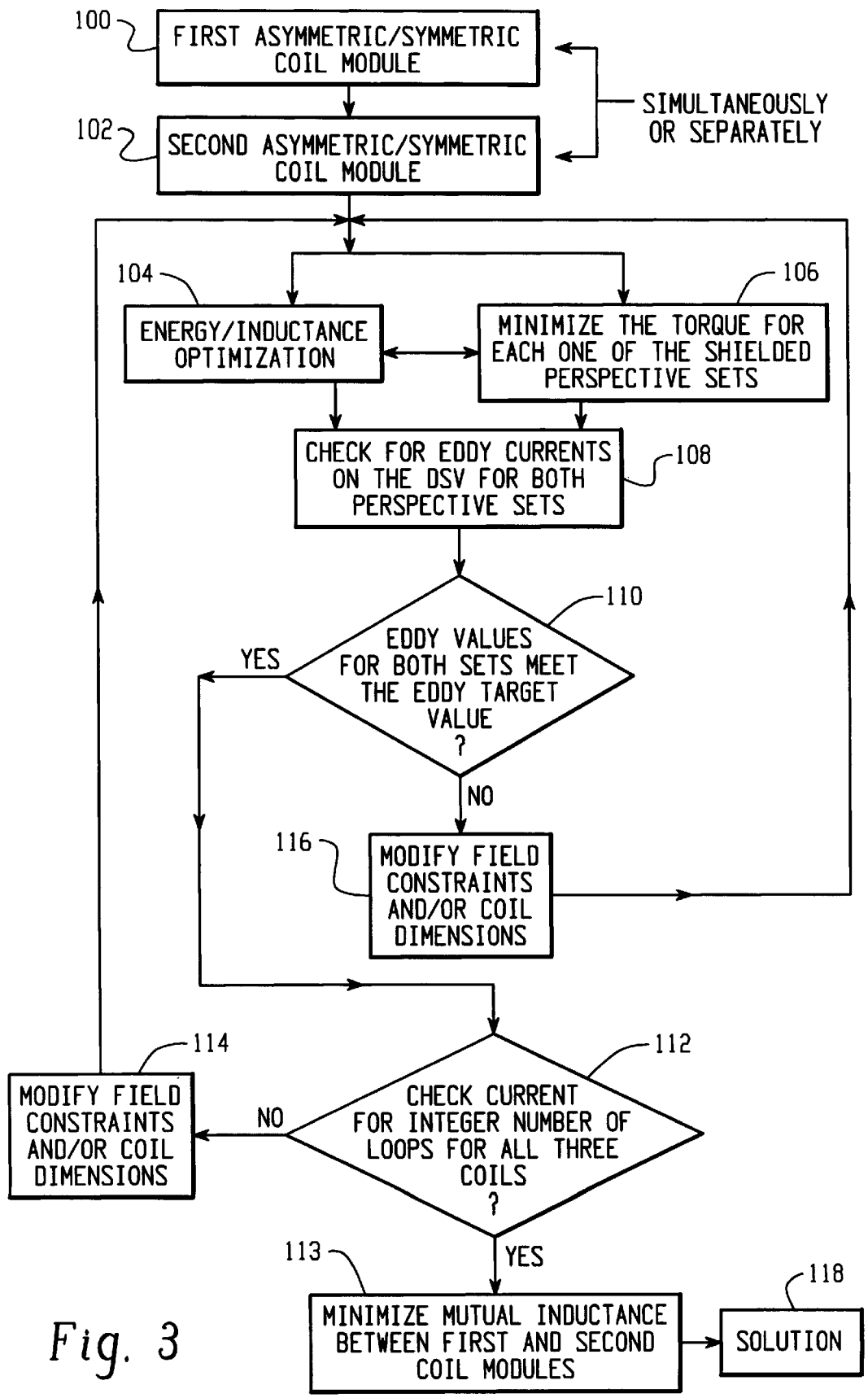
FIG. 3 is a flow chart for designing an asymmetric shielded gradient coil assembly with minimized mutual inductance in accordance with the present invention.

The flow chart for designing such a gradient coil assembly is shown in FIG. 3. Initially, a geometric configurations step sets the geometric configurations of the first asymmetric primary coil with the first symmetric shield 100 and the second asymmetric primary coil with the second asymmetric shield 102. Namely, radius and length for each coil set are chosen. Next, an energy/inductance minimization step 104 optimizes each gradient coil set. In addition, a torque minimization step 106 minimizes the torque on each gradient coil set. Next, eddy currents inside a prescribed imaging volume are evaluated for each primary coil configuration 108. The eddy currents from each primary coil set with their corresponding shields are compared to target values for the particular volume 110.

If the eddy current target values are met, a current discretization step 112 discretizes the continuous current distributions of each coil set to generate the number of turns which is required for each coil within each coil set. Next, the primary coil and associated shield are examined to determine whether each has an exact integer number of turns when they share common current 112. If this condition is satisfied, a mutual inductance minimization algorithm 113 is performed in order to minimize the mutual inductance between the first and second coil modules. If the condition is not satisfied, the field characteristics and/or coil geometric configurations are modified 114 and the process proceeds again from the optimization step 104. Similarly, if the eddy current inside the prescribed imaging volume 110 do not meet the target values, the field characteristics and/or coil geometric configurations are modified 116 and the process proceeds again from the optimization step 104. The process continues until an acceptable solution is found 118 which satisfies the target criteria.

The theoretical development of the energy optimization algorithm step 104 is discussed for both the transverse and the axial gradient coil.

The design of a finite, shielded asymmetric transverse x-gradient coil involves the design of the primary coil (the coil closest to the subject) based on the inverse approach methodology. For the exemplary transverse coil the gradient magnetic field is anti-symmetric in the x direction around the sweet spot of the gradient field, while it is symmetric along the y and z directions. The radius of the inner primary coil is denoted by a and its total length is restricted to $L_a$. For the outer shield coil, its radius is denoted by b with an unrestricted length. Furthermore, the sweet spot of the gradient coil is displaced axially from the geometric center of the gradient structure and towards one of its two ends. To generate such a field, the analytical expression of the current for the primary coil $J^a(r)$ can be written as:

$$\vec{J}^a(\vec{r}) = [j_\phi^a(\phi, z)\hat{a}_\phi + j_z^a(\phi, z)\hat{a}_z]\delta(\sigma - a) \quad (1)$$

where $\delta(\sigma-a)$ is the restriction that the current is confined to a cylindrical surface with radius a. The restriction to inner coil length, the confinement of the current density on the cylindrical surface, the azimuthal and axial symmetries for the $j_\phi^a$ and $j_z^a$ and the constraint that the current density obeys the continuity equation provides the Fourier series expansion for both components around the geometric center of the coil as follows:

$$j_\phi^a(\phi, z) = \cos(\phi) \sum_{n=1}^{\infty} [j_{1n}^a \cos(k_{1n} z) + j_{2n}^a \sin(k_{2n} z)] \quad (2)$$

for $|z| \leq \frac{L_a}{2}$ $$j_z^a(\phi, z) = \sin(\phi) \sum_{n=1}^{\infty} \left[ \frac{j_{1n}^a}{k_{1n} a} \sin(k_{1n} z) - \frac{j_{2n}^a}{k_{2n} a} \cos(k_{2n} z) \right] \quad (3)$$

for $|z| \leq \frac{L_a}{2}$ $$j_\phi^a(\phi, z) = 0 \quad \text{for } |z| > \frac{L_a}{2} \quad (4)$$

$$j_z^a(\phi, z) = 0 \quad \text{for } |z| > \frac{L_a}{2} \quad (5)$$

where $j^a_{1n}, j^a_{2n}$ are the Fourier coefficients, $L_a$ represents the total length of the inner coil, and $k_{1n}=(2n\pi)/L_a$, $k_{2n}=(2n-1)\pi/L_a$ since the current does not flow off the ends of the cylinder. Furthermore, both current components are zero for $|z|>L_a/2$.

In order minimize the fringe field of the primary coil in the area which is outside both the primary and the shielding coils, the Fourier transform of the current for the shielding coil satisfies the following relationship:

$$j_\phi^b(\pm 1, k) = -\frac{aI_1'(ka)}{bI_1'(kb)} j_\phi^a(\pm 1, k) \quad (6)$$

with $$j_\phi^a(\pm 1, k) = \frac{L_a}{4} \sum_{n=1}^{\infty} [j_{1n}^a \psi_{1n}(k) + i \, j_{2n}^a \psi_{2n}(k)] \quad (7)$$

with $$\psi_{1n}(k) = \left[ \frac{\sin(k - k_{1n})\frac{L_a}{2}}{(k - k_{1n})\frac{L_a}{2}} + \frac{\sin(k + k_{1n})\frac{L_a}{2}}{(k + k_{1n})\frac{L_a}{2}} \right] \quad (8)$$

$$\psi_{2n}(k) = \left[ -\frac{\sin(k - k_{2n})\frac{L_a}{2}}{(k - k_{2n})\frac{L_a}{2}} + \frac{\sin(k + k_{2n})\frac{L_a}{2}}{(k + k_{2n})\frac{L_a}{2}} \right] \quad (9)$$

with $$j_\phi^a(-1,k) = j_\phi^a(+1,k) \quad (10)$$

$$\psi_{1n}(-k) = \psi_{1n}(k), \; \psi_{2n}(-k) = -\psi_{2n}(k) \quad (11)$$

where $I'_m$, $K'_m$, represent the derivatives with respect to the argument of the modified Bessel functions of the first and the second kind.

In this case, the expression for the z component of the magnetic field in the area inside both coils can be written as:

$$B_z = -\frac{\mu_0 a L_a}{2\pi}\cos(\phi)\sum_{n=1}^{\infty} j_{1n}^a \int_0^{+\infty} dk\ k\ \cos(kz)\psi_{1n}(k)I_1(k\rho)K_1'(ka) \quad (12)$$

$$\left[1 - \frac{I_1'(ka)K_1'(kb)}{I_1'(kb)K_1'(ka)}\right] + \frac{\mu_0 a L_a}{2\pi}\cos(\phi)\sum_{n=1}^{\infty} j_{2n}^a$$

$$\int_0^{+\infty} dk\ k\ \sin(kz)\psi_{2n}(k)I_1(k\rho)K_1'(ka)\left[1 - \frac{I_1'(ka)K_1'(kb)}{I_1'(kb)K_1'(ka)}\right]$$

Furthermore, the expression for the stored magnetic energy can also be written as:

$$W = -\frac{\mu_0 a^2 L_a^2}{8}\sum_{n=1}^{\infty}\sum_{n'=1}^{\infty}\int_0^{+\infty} dk\ I_1'(ka)K_1'(ka)\left[1 - \frac{I_1'(ka)K_1'(kb)}{I_1'(kb)K_1'(ka)}\right] \quad (13)$$

$$[j_{1n}^a j_{1n'}^a \psi_{1n}(k)\psi_{1n'}(k) + j_{2n}^a j_{2n'}^a \psi_{2n}(k)\psi_{2n'}(k)]$$

terms of W and $B_z$ as:

$$E(j_n^a) = W - \Sigma_{j=1}^N \lambda_j(B_z(\vec{r}_j) - B_{zSC}(\vec{r}_j)) \quad (13a)$$

where $\lambda_j$ are the Lagrange multipliers and $B_{zSC}$ represents the constraint values of the z component of the magnetic field at the specified N points. Minimizing E, a quadratic function of the current, with respect to the current coefficients $j_{1n}^a$, results in a matrix equation for $j_{1n'}^a$ as:

$$\sum_{n'=1}^{\infty} j_{1n'}^a \left(-\frac{aL_a\pi}{2}\int_0^{+\infty} dk\psi_{1n}(k)\psi_{1n'}(k)I_1'(ka)K_1'(ka)\right) \quad (14)$$

$$\left[1 - \frac{I_1'(ka)K_1'(kb)}{I_1'(kb)K_1'(ka)}\right] = -\sum_{j=1}^{N} \lambda_j \cos(\phi_j)\int_0^{+\infty} dk\ k\ \cos(kz_j)$$

$$\psi_{1n}(k)I_1(k\rho_j)K_1'(ka)\left[1 - \frac{I_1'(ka)K_1'(kb)}{I_1'(kb)K_1'(ka)}\right]$$

where the evaluation of the Lagrange multipliers $\lambda_j$ can be done via the constraint equation. Furthermore, the variation of E with respect to the second Fourier coefficient $j_{2n}^a$ provides a matrix equation for $j_{2n'}^a$, which is:

$$\sum_{n'=1}^{\infty} j_{2n'}^a \left(-\frac{aL_a\pi}{2}\int_0^{+\infty} dk\psi_{2n}(k)\psi_{2n'}(k)I_1'(ka)K_1'(ka)\right) \quad (15)$$

$$\left[1 - \frac{I_1'(ka)K_1'(kb)}{I_1'(kb)K_1'(ka)}\right] = \sum_{j=1}^{N} \lambda_j \cos(\phi_j)$$

$$\int_0^{+\infty} dk\ k\ \sin(kz_j)\psi_{2n}(k)I_1(k\rho_j)K_1'(ka)\left[1 - \frac{I_1'(ka)K_1'(kb)}{I_1'(kb)K_1'(ka)}\right]$$

By truncating the previous infinite summations to an upper limit M, the matrix representations of the above equations become:

$$J_\phi^a{}_1 C = \lambda D \rightarrow J_\phi^a{}_1 = \lambda D C^{-1} \quad (16)$$

$$J_\phi^a{}_2 P = \lambda Q \rightarrow J_\phi^a{}_2 = \lambda Q P^{-1} \quad (17)$$

Inverting the previous matrix equation, a solution for $j_{1n'}^a$, $j_{2n'}^a$ and hence for the current density, is obtained. When the continuous current distribution for both the primary and shield coils is evaluated, the stream function technique is used to discretize the current density for both primary and shield coils in such a way that an absolute integer number of turns is obtained for both coils for a given common current value per loop. The discretization and the magnetic gradient field and eddy currents inside the desired imaging volume are then calculated proceeding with steps 108 through 118 of FIG. 3. It is to be appreciated that all of the above expressions which were derived for asymmetric coils apply to the design of symmetric coils where $j_{2n}^a = 0$.

The second asymmetric primary and shield coils are optimized using the above method. Next, the mutual inductance between the first and second actively shielded asymmetric transverse coils is evaluated. For the two actively shielded designs, the radii of the primary and shield coils of the first structure are denoted as a and b, while the radii for the primary and shield coils of the second structure are denoted as a' and b'. The expression for the energy component which contributes to the mutual inductance between the first and second structures for transverse gradient coils is:

$$W = -2\mu_0 a\ a' \quad (18)$$

$$\int_0^{+\infty} dk\ I_1'(ka)K_1'(ka')\left[1 - \frac{I_1'(ka')K_1'(kb)}{I_1'(kb)K_1'(ka')}\right]\left[j_\phi^a j_\phi^{a'*} + j_\phi^{a*} j_\phi^{a'}\right]$$

Considering a translation of $z_0$ of the second coil structure with respect to the first coil structure, the expression of the finite current densities for both primary coils are:

$$j_\phi^a(\pm 1, k) = \frac{L_a}{4}\sum_{n=1}^{\infty}[j_{1n}^a \psi_{1n}(k) + i\ j_{2n}^a \psi_{2n}(k)]j_\phi^{a'+z_0}(\pm 1, k) = \quad (19)$$

$$\frac{L_a'}{4}\sum_{n=1}^{\infty}[A_{1n}\psi_{1n}'(k) + iA_{2n}\psi_{2n}'(k) + iB_{1n}\sigma_{1n}(k) - B_{2n}\sigma_{2n}(k)]$$

where $\psi'_{1n}(k)$, $\psi'_{2n}(k)$ are similar expressions to $\psi_{1n}(k)$ and $\psi_{2n}(k)$ respectively, except that $L_a$ is replaced by $L_{a'}$.

$$\sigma_{1n}(k) = \left[-\frac{\sin(k-k_{1n})\frac{L_a'}{2}}{(k-k_{1n})\frac{L_a'}{2}} + \frac{\sin(k+k_{1n})\frac{L_a'}{2}}{(k+k_{1n})\frac{L_a'}{2}}\right] \quad (20)$$

$$\sigma_{2n}(k) = \left[\frac{\sin(k-k_{2n})\frac{L_a'}{2}}{(k-k_{2n})\frac{L_a'}{2}} + \frac{\sin(k+k_{2n})\frac{L_a'}{2}}{(k+k_{2n})\frac{L_a'}{2}}\right]$$

$A_{1n} = j_{1n}{}^{a'}\cos(k_{1n}z_0)$, $A_{2n} = j_{2n}{}^{a'}\cos(k_{2n}z_0)$ $B_{1n} = j_{1n}{}^{a'}\sin(k_{1n}z_0)$, $B_{2n} = j_{2n}{}^{a'}\sin(k_{2n}z_0)$ (21)

The product inside the integral on equation (18) becomes:

$$j_\phi^a j_\phi^{a'*} + j_\phi^{a*} j_\phi^{a'} = \quad (22)$$

$$\frac{L_a L_a'}{8}\sum_{n=1}^{\infty}[A_{1n}j_{1n}^a\psi_{1n}(k)\psi_{1n}'(k) - B_{2n}j_{1n}^a\sigma_{2n}(k)\psi_{1n}(k) +$$

$$A_{2n}j_{2n}^a\psi_{2n}(k)\psi_{2n}'(k) + B_{1n}j_{2n}^a\sigma_{1n}(k)\psi_{2n}(k)]$$

For the design of the exemplary primary x-gradient coil, the radius of the cylinder for the first primary coil is set equal to 0.336134 m and its length is $L_a = 0.90$ m. In addition, the radius of the first shield coil is equal to 0.435354 m. For the second coil structure, the radius of the second primary coil is set equal to 0.342327 m, with a total length of 0.725 m. The radius of the second shield coil is equal to 0.430984 m. The constraints for the design of the first coil structure are shown in Table 1. The constraints for the second coil are shown in Table 2.

TABLE 1

Constraint set used for the design for the x-gradient coil of the first coil structure. Values for p and z are in m, values for $B_{zsc}$ (T) are in Tesla.

| n | $P_i$ | $Z_i$ | $B_{zsc}$ (T) |
|---|-------|-------|---------------|
| 1 | 0.001 | −0.218 | 0.0000210000 |
| 2 | 0.315 | −0.208 | 0.0059516000 |
| 3 | 0.001 | −0.008 | 0.0000156000 |
| 4 | 0.001 | −0.398 | 0.0000156050 |

TABLE 2

Constraint set used for the design for the x-gradient coil of the first coil structure. Values for p and z are in m, values for $B_{zsc}$ (T) are in Tesla.

| n | $P_i$ | $Z_i$ | $B_{zsc}$ (T) |
|---|-------|-------|---------------|
| 1 | 0.001 | −0.228 | 0.00003200000 |
| 2 | 0.335 | −0.228 | 0.00930866000 |
| 3 | 0.001 | −0.128 | 0.00002740000 |
| 4 | 0.001 | −0.328 | 0.00002445000 |

Figure 4B:
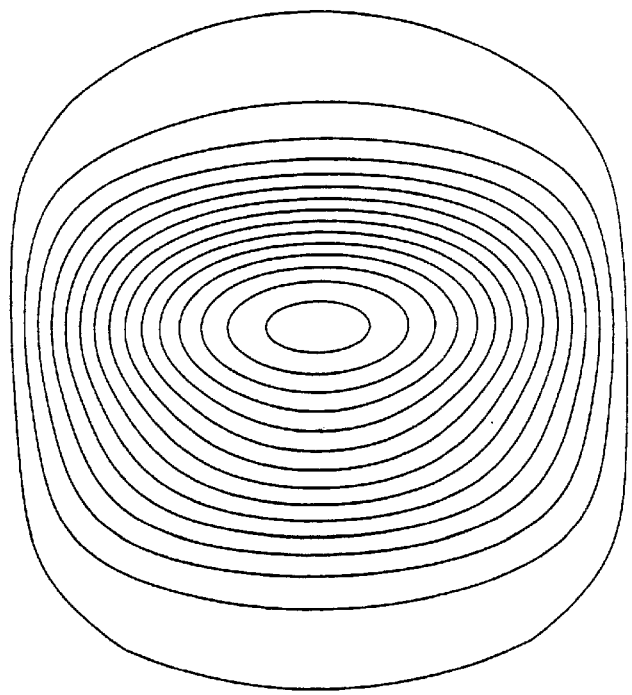
Figure 5B:
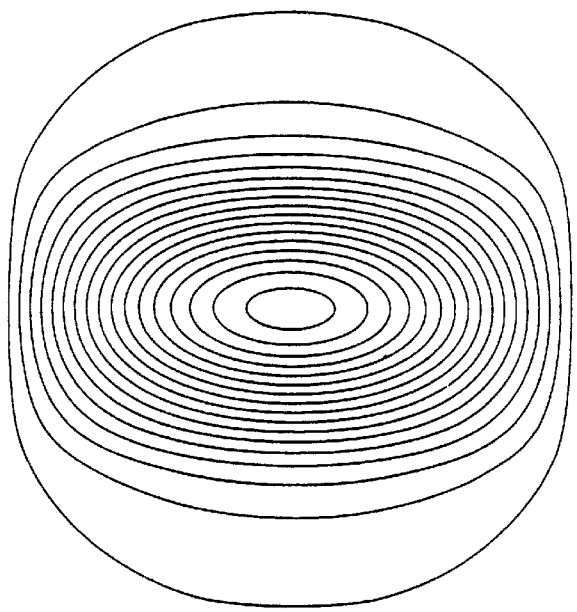
Figure 6:
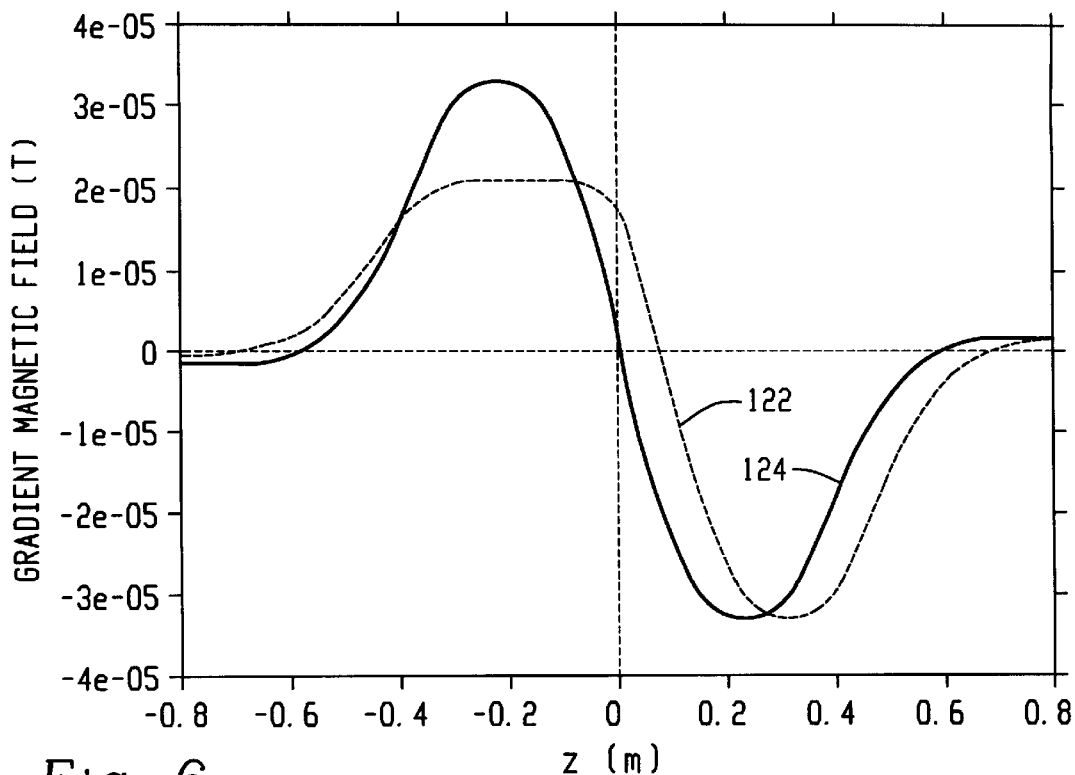
FIG. 6 is a plot of gradient magnetic field vs. position along the z-axis at a radial position of 1 mm for the exemplary first and second transverse gradient coils in accordance with the present invention.
Figure 7:
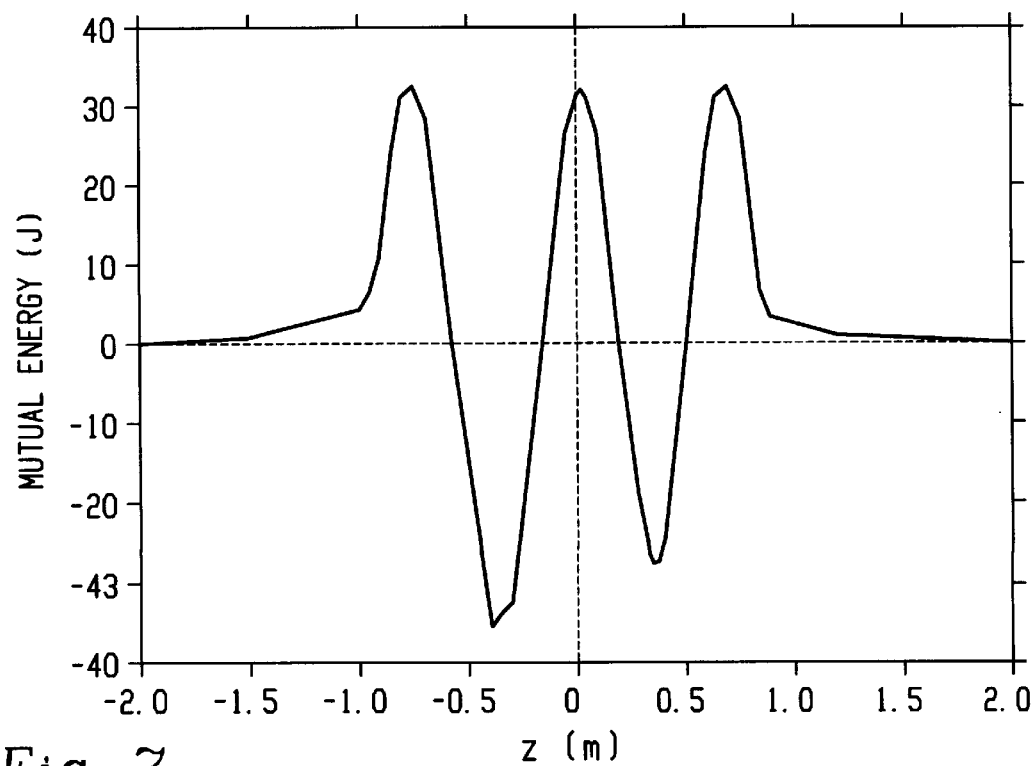
FIG. 7 is a plot of mutual energy vs. position along the z-axis for the first and second asymmetric transverse gradient coils in accordance with the present invention.

With the presence of these constraints on Tables 1 and 2, the application of the inverse approach methodology of FIG. 3, the values for the Fourier coefficients for the current density of the first and second gradient coil structures are generated. Applying the Stream Function technique to the continuous current densities for both sets of coils, the discrete current patterns for these coils are generated. Specifically, for the first x-gradient coil, the Stream Function technique generates 23 discrete loops on the primary coil, as shown in FIG. 4A and 15 loops on the shield coil, as shown in FIG. 4B. By discretizing the current density for the second x-gradient coil, the current density for the exemplary primary coil is approximated by 30 loops, as shown in FIG. 5A, while the shielding coil can be approximated by 17 loops (FIG. 5B). Table 3 illustrates the magnetic properties of the exemplary first and second gradient coil structures. FIG. 6 is a plot of the gradient magnetic field at a radial position of 1 mm vs. position along the z-axis for the exemplary first 122 and second 124 self-shielded, asymmetric gradient coil structures. From this plot, it is seen that the mutual inductance between these two structures can be minimized when the second gradient coil structure 124 is shifted along the z-axis by 0.2033 m from left to right. In this case, the first primary gradient coil 122 is situated from z=−45 cm to z=+45 cm, while the second primary gradient coil 124 is positioned from z=−0.1592 to z=+0.5658. Further, FIG. 7 is a plot of the mutual energy of the two exemplary self-shielded, asymmetric gradient coil structures vs. position along the z-axis. The zeroes of the mutual energy correspond to the mutual inductance between the two self-shielded, asymmetric gradient coil structures as one gradient coil structure is displaced relative to the other gradient coil structure along the z direction. As shown in FIG. 7, for each positive and negative z position, there exists two points where the mutual energy between the two gradient coil structures from their interaction is zero.

Figure 8A:
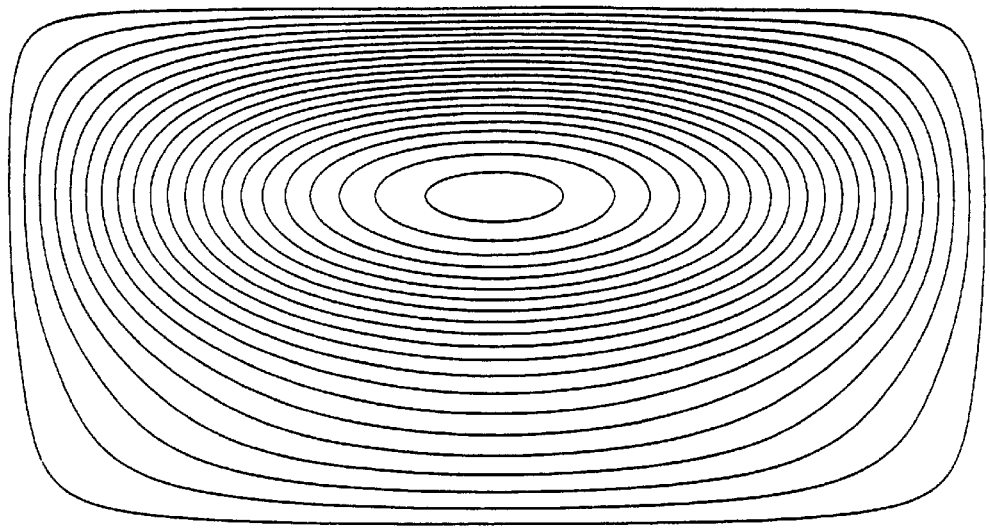
FIGS. 8A and 8B are diagrammatic illustrations of an exemplary first primary symmeric x-gradient coil and a corresponding first shield coil in accordance with the present invention.
Figure 8B:
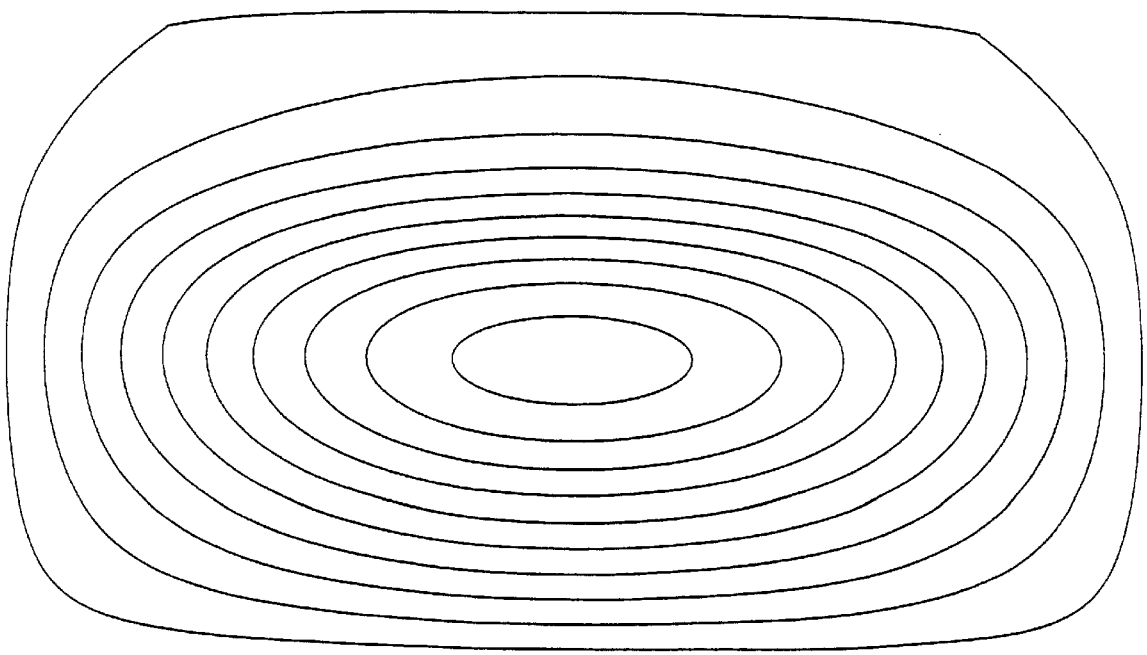
Figure 9A:
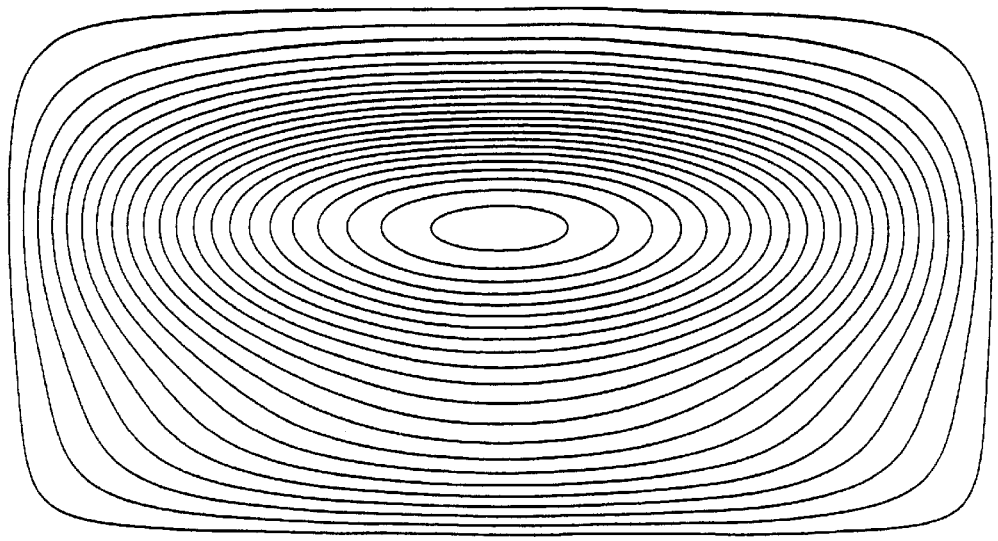
FIGS. 9A and 9B are diagrammatic illustrations of an exemplary second primary symmetric x-gradient coil and a corresponding second shield coil in accordance with the present invention.
Figure 9B:
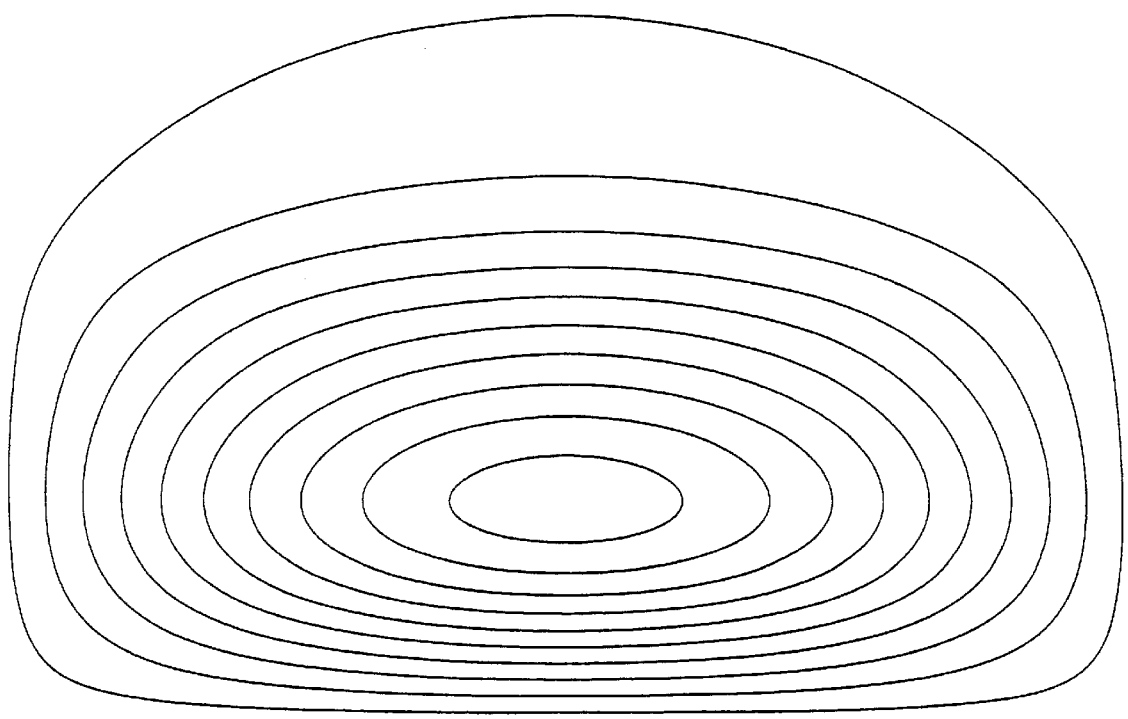
Figure 10:
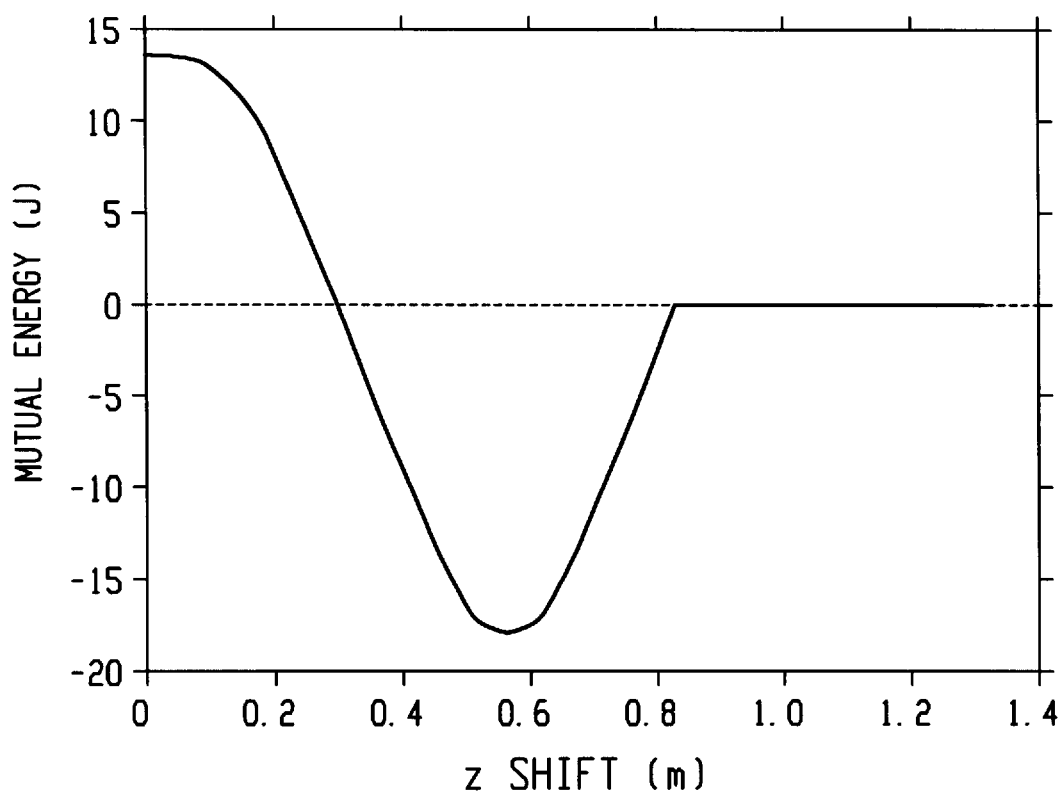
FIG. 10 is a plot of mutual energy vs. z-shift for the first and second symmetric transverse gradient coils in accordance with the present invention.

The above inverse approach methodology may be applied to the design of symmetric coils as well, where $j^a_{2n}=0$. FIG. 8A illustrates an exemplary first primary symmetric x-gradient coil designed by the above method, while FIG. 8B illustrates a corresponding first shield coil. In addition, FIGS. 9A and 9B illustrate a second primary symmetric x-gradient coil and a corresponding second shield coil designed by the above method. FIG. 10 is a plot of the mutual energy versus z-shift for a finite symmetric twin gtransverse gradient coil. The zeroes of the mutual energy correspond to the mutual inductance between the two self-shielded, symmetric gradient coil structures as one gradient coil structure is displaced relative to the other gradient coil structure along the z-axis.

TABLE 3

Gradient field characteristics for the first and second asymmetric gradient coil sets.
Actively Shielded x Asymmetric gradient coil

| Properties | First Asymmetric Coil Module | Second Asymmetric Coil Module |
|---|---|---|
| Radius (prim/second) | 0.336134 m/0.430984 m | 0.342327 m/0.435324 m |
| Length (prim/second) | 0.90 m/1.25 m | 0.725 m/1.15 m |
| Loops (prim/second) | 23/15 | 30/17 |
| Inductance + Cable | 425 μH | 561 μH |
| Resistance + Cable | 136 mΩ | 132 mΩ |
| Gradient Strength @440 A | 22 mT/m | 35.9 mT/m |
| Gradient linearity (p = ± 25 cm) | 8.5% | — |
| Gradient linearity (p = ± 22.5 cm) | — | 8.3 |
| Gradient Uniformity (z = ± 22.5 cm) | 27.2% | — |
| Gradient Uniformity (z = ± 12.5 cm) | — | 11.4 |
| Rollover distance at Z(cm) | 75 cm | 58.8 cm |
| Liner Slew Rate @ 650 V | 70 T/m/sec | 86 T/m/sec |
| Liner Slew Rate @ 1200 V | 135 T/m/sec | 166 T/m/sec |
| Sine Slew Rate @ 650 V | 76 T/m/sec | 94 T/m/sec |
| Sine Slew Rate @ 1200 V | 141 T/m/sec | 174 T/m/sec |
| Torque (ft-lbs) | 50 ft-lbs | 79 ft-lbs |
| Thrust | 43 lbs | 49 lbs |

Initially, the design of the shielded, axial asymmetric z-gradient coil involves the design of the primary coils (the coil that is closest to the subject) based on the inverse approach methodology. For z-gradient coils, the gradient magnetic field is anti-symmetric in the z direction around the sweet spot of the gradient, while it is symmetric along the x and y directions. Considering the design of each axial asymmetric coil separately, the radius of the first primary coil is denoted as a with a total length $L_a$ and the radius of the shield coil is denoted as b. The analytical expression of the current for the primary coil $J^a(r)$ can be written as:

$$j^a_\phi(z) = \sum_{n=1}^{\infty} [j^a_{1n}\sin(k_{1n}z) + j^a_{2n}\cos(k_{2n}z)] \quad \text{for} \quad |z| \leq \frac{L_a}{2} \quad (23)$$

$$j^a_\phi(z) = 0 \quad \text{for} \quad |z| > \frac{L_a}{2} \quad (24)$$

where $j^a_{1n}$, $j^a_{2n}$ are the coefficients associated with the two terms in the Fourier expansion. The Fourier transform of the above expression can be written as:

$$j_\phi^a(k) = \frac{iL_a}{2}\sum_{n=1}^{\infty}[j_{1n}^a\psi_{1n}(k) - i\, j_{2n}^a\psi_{2n}(k)] \qquad (25)$$

with $$\psi_{1n}(k) = \left[-\frac{\sin(k-k_{1n})\frac{L_a}{2}}{(k-k_{1n})\frac{L_a}{2}} + \frac{\sin(k+k_{1n})\frac{L_a}{2}}{(k+k_{1n})\frac{L_a}{2}}\right] \qquad (26)$$

$$\psi_{2n}(k) = \left[\frac{\sin(k-k_{2n})\frac{L_a}{2}}{(k-k_{2n})\frac{L_a}{2}} + \frac{\sin(k+k_{2n})\frac{L_a}{2}}{(k+k_{2n})\frac{L_a}{2}}\right]$$

In addition, due to the shielding condition, the current density of the shield coil is related to the current density of the primary coil via the equation:

$$j_\phi^b(k) = -\frac{aI_1(ka)}{bI_1(kb)}j_\phi^a(k) \qquad (27)$$

Therefore, the expressions of the z-component of the magnetic field and the stored magnetic energy become:

$$B_z = -\frac{\mu_0 a L_a}{2\pi}\sum_{n=1}^{\infty} j_{1n}^a \int_0^{+\infty} dk\, k\, \sin(kz)\psi_{1n}(k)I_0(k\rho)K_1(ka) \qquad (28)$$

$$\left[1 - \frac{I_1(ka)K_1(kb)}{I_1(kb)K_1(ka)}\right] + \frac{\mu_0 a L_a}{2\pi}$$

$$\sum_{n=1}^{\infty} j_{2n}^a \int_0^{+\infty} dk\, k\, \cos(kz)\psi_{2n}(k)I_0(k\rho)K_1(ka)\left[1 - \frac{I_1(ka)K_1(kb)}{I_1(kb)K_1(ka)}\right]$$

and $$W_m = \frac{\mu_0 a^2 L_a^2}{4}\sum_{n=1}^{\infty}\sum_{n'=1}^{\infty}\int_0^{\infty} dk\, I_1(ka)K_1(ka)\left[1 - \frac{I_1(ka)K_1(kb)}{I_1(kb)K_1(ka)}\right] \qquad (29)$$

$$[j_{1n}^a j_{1n'}^a \psi_{1n}(k)\psi_{1n'}(k) + j_{2n}^a j_{2n'}^a \psi_{2n}(k)\psi_{2n'}(k)]$$

In order to find an expression for current density which minimizes the total energy of the system, while the magnetic field satisfies a prescribed set of constraints inside the desired imaging volume, Turner's method is used to construct the functional E:

$$E(j_{\phi n}^a) = W_m - \Sum_{j=1}^{N}\lambda_j(B_z(\vec{r}_j) - B_{zSC}(\vec{r}_j)) \qquad (30)$$

The minimization of E with respect to $j_{1n}^a$ gives:

$$\sum_{n'=1}^{\infty} j_{1n'}^a(aL_a\pi)\int_0^{+\infty} dk\psi_{1n}(k)\psi_{1n'}(k)I_1(ka)K_1(ka) \qquad (31)$$

$$\left[1 - \frac{I_1(ka)K_1(kb)}{I_1(kb)K_1(ka)}\right] = -\sum_{j=1}^{N}\lambda_j\int_0^{+\infty} dk\, k\, \sin(kz_j)$$

$$\psi_{1n}(k)I_0(k\rho_j)K_1(ka)\left[1 - \frac{I_1(ka)K_1(kb)}{I_1(kb)K_1(ka)}\right]$$

Putting a limit to the infinite summations to M terms, the matrix representation of the previous equation is:

$$J_1^a C = \lambda D \rightarrow J_1^a = \lambda D C^{-1} \qquad (32)$$

where $\underline{J}^a_1$ is a 1×M matrix, $\underline{C}$ is a M×M matrix, $\underline{\lambda}$ is a 1×N matrix, and $\underline{D}$ is a N×M matrix.

Following the same methodology for the second Fourier component $j^a_{2n}$, its corresponding relation is:

$$\sum_{n'=1}^{\infty} j_{2n'}^a(aL_a\pi)\int_0^{+\infty} dk\psi_{2n}(k)\psi_{2n'}(k)I_1(ka)K_1(ka) \qquad (33)$$

$$\left[1 - \frac{I_1(ka)K_1(kb)}{I_1(kb)K_1(ka)}\right] = \sum_{j=1}^{N}\lambda_j$$

$$\int_0^{+\infty} dk\, k\, \cos(kz_j)\psi_{2n}(k)I_0(k\rho_j)K_1(ka)\left[1 - \frac{I_1(ka)K_1(kb)}{I_1(kb)K_1(ka)}\right]$$

Putting a threshold to the infinite summation, the matrix equation for $j^a_{2n}$ is:

$$J_2^a P = \lambda Q \rightarrow J_2^a = \lambda Q P^{-1} \qquad (34)$$

where $\underline{J}^a_2$ is a 1×M matrix, $\underline{P}$ is a M×M matrix, $\underline{\lambda}$ is a 1×N matrix, and $\underline{Q}$ is a N×M matrix. It is to be appreciated that all of the above expressions which were derived for asymmetric coils apply to the design of symmetric coils where $j^a_{2n}=0$.

The second axial asymmetric primary and shield coils are optimized using the above method. Next, the mutual inductance between the first and second axial, actively shielded, asymmetric transverse coils is evaluated. For the two actively shielded designs, the radii of the primary and shield coils of the first structure are denoted as a and b, while the radii for the primary and shield coils of the second structure are denoted as a' and b'. The expression for the energy component which contributes to the mutual inductance between the first and second structures for axial gradient coils is:

$$W = \qquad (35)$$

$$2\mu_0 a\, a' \int_0^{+\infty} dk\, I_1(ka)K_1(ka')\left[1 - \frac{I_1(ka')K_1(kb)}{I_1(kb)K_1(ka')}\right][j_\phi^a j_\phi^{a'*} + j_\phi^{a*} j_\phi^{a'}]$$

Considering a translation of $z_0$ of the second coil structure with respect to the first coil structure, the expression of the finite current densities for both primary coils are:

$$j_\phi^a(k) = \frac{iL_a}{2}\sum_{n=1}^{\infty}[j_{1n}^a\psi_{1n}(k) - ij_{2n}^a\psi_{2n}(k)] \qquad (36)$$

$$j_\phi^{a'+z_0}(k) =$$

$$\frac{L_{a'}}{2}\sum_{n=1}^{\infty}[iA_{1n}\psi'_{1n}(k) - A_{2n}\sigma_{1n}(k) + B_{1n}\psi'_{2n}(k) + iB_{2n}\sigma_{2n}(k)]$$

where $\psi'_{1n}(k)$, $\psi'_{2n}(k)$ are similar expressions to $\psi_{1n}(k)$ and $\psi_{2n}(k)$ respectively, except that $L_a$ is replaced by $L_{a'}$.

$$\sigma_{1n}(k) = \left[\frac{\sin(k-k_{1n})\frac{L'_a}{2}}{(k-k_{1n})\frac{L'_a}{2}} + \frac{\sin(k+k_{1n})\frac{L'_a}{2}}{(k+k_{1n})\frac{L'_a}{2}}\right] \qquad (37)$$

$$\sigma_{2n}(k) = \left[-\frac{\sin(k-k_{2n})\frac{L'_a}{2}}{(k-k_{2n})\frac{L'_a}{2}} + \frac{\sin(k+k_{2n})\frac{L'_a}{2}}{(k+k_{2n})\frac{L'_a}{2}}\right]$$

$$A_{1n}=j_{1n}^{a'}\cos(k_{1n}z_0),\ A_{2n}=j_{2n}^{a'}\sin(k_{1n}z_0)\ B_{1n}=j_{1n}^{a'}\cos(k_{2n}z_0),\ B_{2n}=j_{2n}^{a'}\sin(k_{2n}z_0) \qquad (38)$$

The product inside the integral on equation (35) becomes:

$$j_\phi^a j_\phi^{a'*} + j_\phi^{a*} j_\phi^{a'} = \qquad (39)$$

$$\frac{L_a L'_a}{2} \sum_{n=1}^{\infty} [A_{1n} f_{1n}^2 \psi_{1n}(k) \psi'_{1n}(k) + B_{2n} f_{1n}^2 \sigma_{2n}(k) \psi_{1n}(k) - A_{2n} f_{2n}^2 \psi_{2n}(k) \sigma_{1n}(k) + B_{1n} f_{2n}^2 \psi'_{2n}(k) \psi_{2n}(k)]$$

Figure 11A:
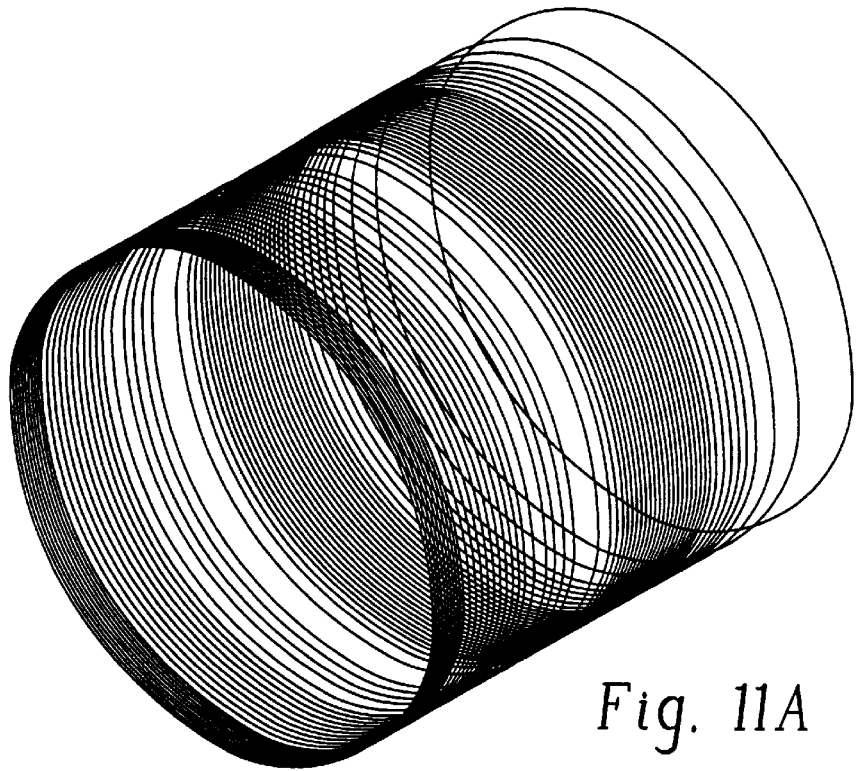
FIGS. 11A and 11B are diagrammatic illustrations of an exemplary first primary asymmetric z-coil and a first shield coil in accordance with the present invention.
Figure 11B:
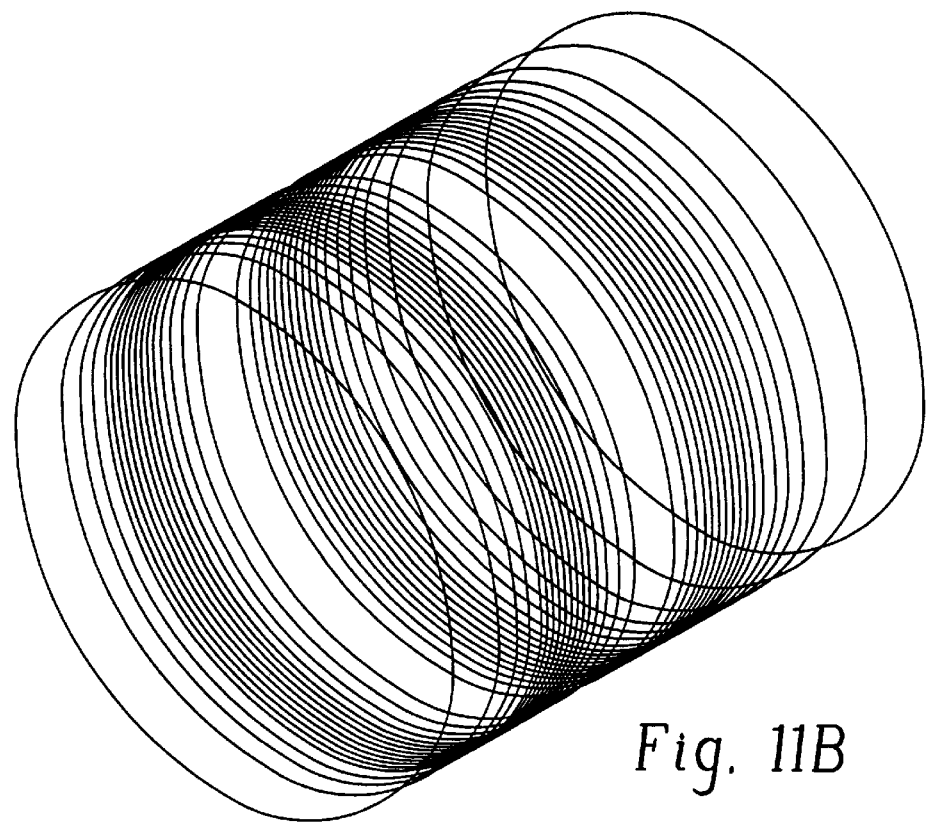

Following the procedure outlined in FIG. 3, first and second axial gradient coil sets are generated. Table 4 summarizes the results for a two coil structure actively-shielded, axial, asymmetric gradient coil set. FIG. 11A provides the exemplary first primary, asymmetric axial gradient coil designed by the procedure outlined in FIG. 3, while FIG. 11B provides the corresponding first asymmetric, axial shield coil in accordance with the present invention.

TABLE 4

Gradient field characteristics for the
first and second asymmetric axial coil sets
Actively Shielded z Asymmetric gradient coil

| Properties | First Asymmetric Coil Module | Second Asymmetric Coil Module |
|---|---|---|
| Radius (prim/second) | 0.354324 m/0.424999 m | 0.360324 m/0.418999 m |
| Length (prim/second) | 0.80 m/1.25 m | 0.7 m/1.1 m |
| Loops (prim/second) | 48/24 | 53/34 |
| Inductance + Cable | 540 $\mu$H | 635 $\mu$H |
| Resistance + Cable | 160 m$\Omega$ | 175 m$\Omega$ |
| Gradient strength @440 A | 26.9 mT/m | 40.5 mT/m |
| Gradient linearity (p = + 25 cm) | 10.5% | — |
| Gradient linearity (p = + 22.5 cm) | — | 8.9% |
| Gradient Uniformity (z = + 22.5 cm) | 7.2% | — |
| Gradient Uniformity (z = + 12.5 cm) | — | 4.3% |
| Rollover distance at Z(cm) | 65 cm | 58.8 cm |
| Liner Slew Rate @ 650 V | 71 T/m/sec | 83 T/m/sec |
| Liner Slew Rate @ 1200 V | 131 T/m/sec | 162 T/m/sec |
| Sine Slew Rate @ 650 V | 74 T/m/sec | 90 T/m/sec |
| Sine Slew Rate @ 1200 V | 136 T/m/sec | 168 T/m/sec |
| Torque (ft-lbs) | 90 ft-lbs | 102 ft-lbs |
| Thrust | 0.02 lbs | 0.15 lbs |

It should be appreciated that the specified current patterns can be changed to produce either better linearity at the price of coil efficiency, and/or greater efficiency at the price of linearity. Further, the dimensions (radius and/or length) of the cylindrical gradient coils can be changed to be increased or decreased according to the preferred application. In addition, the lengths of the primary coils and/or the secondary coils can be similar or different.

The present invention is applicable to other alternative gradient coil geometries, such as elliptical, planar, flared, etc., as well as the symmetric gradient coil designs or any combination thereof. The present invention is also applicable to the design of gradient coil structures suitable for vertically oriented or open magnet systems. Further, the disclosed primary and screen coil set can be bunched (concentrated) or thumbprint designs generated using forward or inverse approach methods. In addition, the primary and the shield coils can have any possible mixing of bunched and/or thumbprint designs. It is contemplated that a minimizing algorithm for zero net thrust force or torque can be incorporated into the proposed design algorithm in a known manner.

Figure 12A:
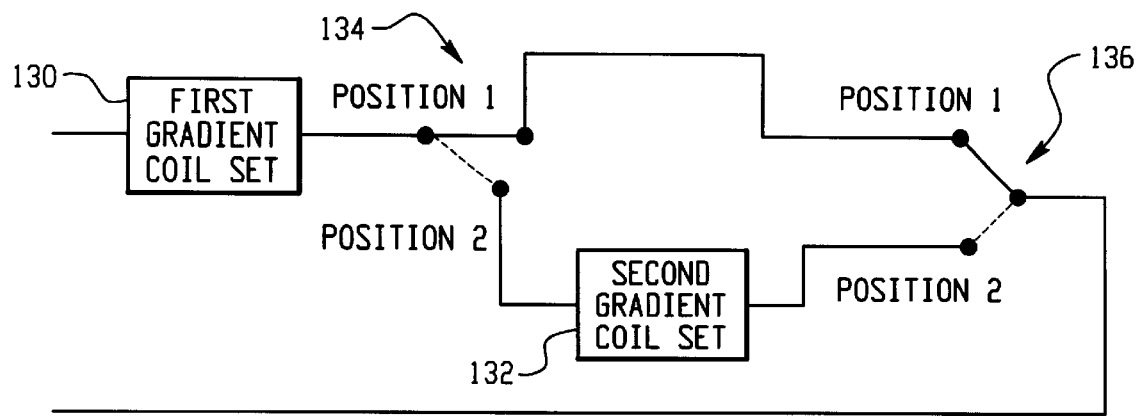
FIGS. 12A, 12B, and 12C are diagrammatic illustrations of various configurations for connecting the first and second gradient coil sets for selective excitation in accordance with the present invention.
Figure 12B:
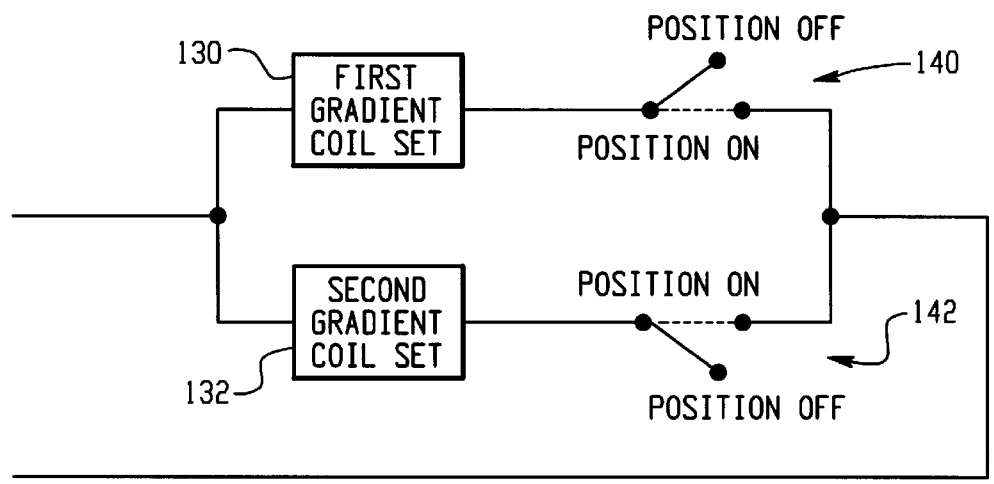
Figure 12C:
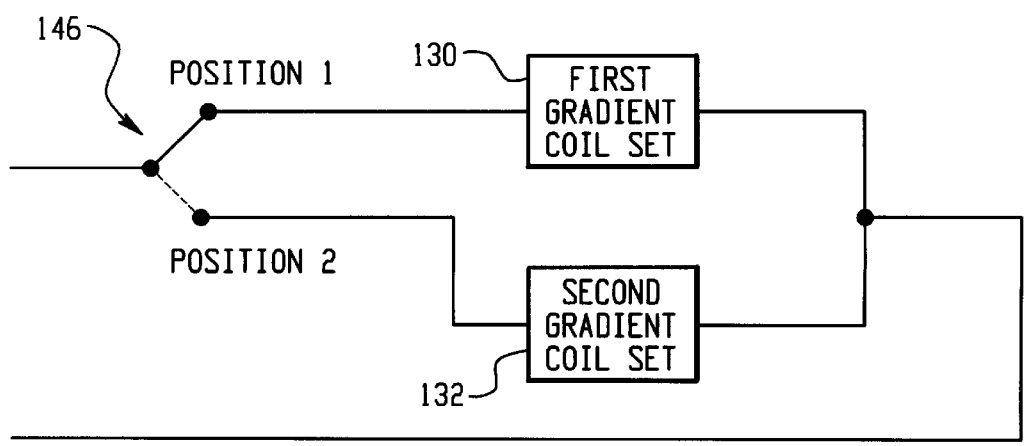

With reference to FIGS. 12A, 12B, and 12C, alternate ways of electrically connecting the first and second asymmetric gradient coil sets are provided. These methods include series and parallel connections of the two asymmetric gradient coil sets in such ways that one or both gradient coil sets may be selectively excited depending on the particular application. For example, in FIG. 9A, the first gradient coil set 130 and second gradient coil set 132 are electrically connected such that with the first and second switches 134, 136 both in position 1, only the first gradient coil set is excited. In contrast, with both switches 134, 136 in position 2, both the first and second gradient coil sets 130, 132 are excited while connected in series.

Alternately, in FIG. 9B, the first gradient coil set 130 is selectively excited with the first switch 140 in the "on position" and the second switch 142 in the "off position." Conversely, the second gradient coil set 132 is selectively excited with the second switch 142 in the on position and the first switch 140 in the off position. With both switches 140, 142 in the on position, both the first and second gradient coil sets 130, 132 are excited while connected in parallel.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A magnetic resonance imaging apparatus comprising:
   a main magnet for generating a main magnetic field through and surrounding an examination region;
   a gradient coil assembly for generating gradient magnetic fields across the examination region, the gradient coil assembly comprising:
      at least a first primary gradient coil set and a second primary gradient coil set disposed in an overlapping relationship, the first primary gradient coil being at least one of axially and radially displaced relative to the second primary gradient coil set by a displacement that minimizes mutual inductance between the at least two gradient coil sets;
   an RF transmitter, receiver, and coil assembly positioned adjacent the examination region such that it excites magnetic resonance dipoles in and adjacent the examination region and receives and demodulates magnetic resonance signals from the resonating dipoles; and
   a reconstruction processor for reconstructing the demodulated magnetic resonance signals into an image representation.

2. The magnetic resonance imaging apparatus according to claim 1, wherein the gradient coil assembly includes at least one shielding coil set disposed between the second primary gradient coil set and the main magnet, the shielding coil set including an array of conductive loops such that a current density flowing thereon causes a magnetic flux density which interacts with a magnetic flux density generated by the at least first and second primary magnetic fields to minimize a net magnetization flux density outside an area defined by the shielding coil set.

3. The magnetic resonance imaging apparatus according to claim 1, wherein the gradient coil assembly includes switching means for selectively coupling said first and second primary gradient coil sets to operate in a selected one of modes in which (i) the first primary gradient coil set is energized individually, (ii) the second primary gradient coil set is energized individually, and (iii) both primary gradient coils sets are energized jointly.

4. The magnetic resonance imaging apparatus according to claim 1, wherein the first and second primary gradient coil sets include an array of conductive loops for generating gradient magnetic fields along three orthogonal axes.

5. The magnetic resonance imaging apparatus according to claim 1, wherein the first primary gradient coil set is a high-efficiency primary gradient coil set that enhances gradient switching speeds for ultra fast MR sequencing, and the second primary gradient coil set is a low-efficiency primary gradient coil set having a high-quality gradient field with a slower switching speed.

6. The magnetic resonance imaging apparatus according to claim 1, wherein the first and second primary gradient coil sets each include x, y, and z-gradient coils, said x, y, and z gradient coils each having a geometric center and a sweet spot in which the magnetic field it generates is substantially linear, said sweet spots of each primary gradient coil set being coincident with each other and with the examination region.

7. The magnetic resonance imaging apparatus according to claim 2, wherein the first and second primary gradient coil sets are mounted on a single gradient coil former, the first primary gradient coil set being mounted on an inside surface of the gradient coil former and the second primary gradient coil set being mounted on an outside surface of the gradient coil former.

8. The magnetic resonance imaging apparatus according to claim 7, wherein the at least one shielding coil set being mounted on a shielding coil former, said shielding coil former having a larger diameter than the gradient coil former.

9. The magnetic resonance imaging apparatus according to claim 1, wherein the first and second primary gradient coil sets generate gradient magnetic fields across the examination region, which gradient magnetic fields have non-zero first derivatives in and adjacent the examination region.

10. The magnetic resonance imaging apparatus according to claim 1, wherein the first and second primary gradient coil sets each define a sweet spot in which generated magnetic fields are linear, at lease one of the first and second primary gradient coil sets being asymmetric with its sweet spot offset from a geometric center thereof.

11. A magnetic resonance imaging apparatus comprising:
a main magnet which generates a main magnetic field through and surrounding an examination region;
a gradient coil assembly which generates gradient magnetic fields across the examination region, the gradient coil assembly comprising:
at least a first primary gradient coil set and a second primary gradient coil set disposed in an overlapping relationship, the first primary gradient coil set being at least one of axially and radially displaced relative to the second primary gradient coil set by a displacement that minimizes mutual inductance between the at least two gradient coil sets is minimized;
wherein at least one of the first and second primary gradient coil sets includes x, y, and z-gradient coils, said x, y, and z-gradient coils each having a geometric center and a sweet spot in which the magnetic field it generates is substantially linear, said sweet spots being coincident with each other and the examination region, but not coincident with the geometric centers of the x, y, and z-gradient coils;
an RF transmitter, receiver, and coil assembly positioned adjacent the examination region such that it excites magnetic resonance dipoles in and adjacent the examination region and receives and demodulates magnetic resonance signals from the resonating dipoles; and
a reconstruction processor for reconstructing the demodulated magnetic resonance signals into an image representation.

12. A method of designing a phased array gradient coil assembly for magnetic resonance imaging systems, the method comprising:
(a) selecting geometric configurations for a first primary coil set having a corresponding first shield coil set and a second primary coil set having a corresponding second shield coil set;
(b) generating first and second continuous current distributions for the first primary and shield coil sets;
(c) generating third and fourth continuous current distributions for the second primary and shield coil sets;
(d) optimizing the first primary coil set with the first shield coil set utilizing an energy/inductance minimization algorithm;
(e) optimizing the second primary coil set with the second shield coil set utilizing an energy/inductance minimization algorithm;
(f) evaluating eddy currents within a prescribed imaging volume for both the first and second primary coil sets;
(g) modifying at least one characteristic of the geometric configuration defined in step (a), and repeating steps (d) through (g) when the eddy currents from either (i) the first primary and shield coil sets or (ii) the second primary and shield coil sets do not meet an eddy current target value for the prescribed imaging volume;
(h) discretizing the first primary and shield coil sets and the second primary and shield coil sets; and
(i) displacing the first primary coil set axially relative to the second primary coil set such that mutual inductance between the two is minimized.

13. The method according to claim 12, where step (g) includes:
(k) modifying at least one of a length and a radius of (i) the first primary and shield coil sets or (ii) the second primary and shield coil sets.

14. The method according to claim 12, where step (g) includes:
(l) modifying a field constraint of (i) the first primary and shield coil sets or (ii) the second primary and shield coil sets.

15. A shielded coil assembly designed by the method of claim 12.

16. A method of designing a phased array gradient coil assembly for magnetic resonance imaging systems, the method comprising:
(a) selecting geometric configurations for a first primary coil set having a corresponding first shield coil set and a second primary coil set having a corresponding second shield coil set;
(b) generating first and second continuous current distributions for the first primary and shield coil sets;
(c) generating third and fourth continuous current distributions for the second primary and shield coil sets;
(d) optimizing the first primary coil set with the first shield coil set utilizing an energy/inductance minimization algorithm;

(e) optimizing the second primary coil set with the second shield coil set utilizing an energy/inductance minimization algorithm, at least one of steps (d) and (e) including minimizing net torque for the respective primary and shield coil sets;

(f) evaluating eddy currents within a prescribed imaging volume for both the first and second primary coil sets; and, (g) modifying at least one characteristic of the geometric configuration defined in step (a), and repeating steps (d) through (g) when the eddy currents from either (i) the first primary and shield coil sets or (ii) the second primary and shield coil sets do not meet an eddy current target value for the prescribed imaging volume.

17. A method of designing a phased array gradient coil assembly for magnetic resonance imaging systems, the method comprising:

(a) selecting geometric configurations for a first primary coil set having a corresponding first shield coil set and a second primary coil set having a corresponding second shield coil set;

(b) generating first and second continuous current distributions for the first primary and shield coil sets;

(c) generating third and fourth continuous current distributions for the second primary and shield coil sets;

(d) optimizing the first primary coil set with the first shield coil set utilizing an energy/inductance minimization algorithm;

(e) optimizing the second primary coil set with the second shield coil set utilizing an energy/inductance minimization algorithm;

(f) evaluating eddy currents within a prescribed imaging volume for both the first and second primary coil sets;

(g) modifying at least one characteristic of the geometric configuration defined in step (a), and repeating steps (d) through (g) when the eddy currents from either (i) the first primary and shield coil sets or (ii) the second primary and shield coil sets do not meet an eddy current target value for the prescribed imaging volume;

(h) discretizing the first primary and shield coil sets and the second primary and shield coil sets;

(i) performing a mutual inductance minimization algorithm to determine a displacement that minimizes mutual inductance between the first and second primary coil sets; and (j) displacing the first primary coil set at least one of axially and radially relative to the second primary coil set by the determined displacement such that mutual inductance between the two is minimized.

18. A phased array gradient coil assembly for generating magnetic gradients across a main magnetic field of a magnetic resonance apparatus, the gradient coil assembly comprising:

a first primary coil set including first x, y, and z-gradient coils, each first gradient coil having a sweet spot in which the magnetic field generated is substantially linear, the sweet spots being coincident with an examination region;

a second primary coil set including second x, y, and z-gradient coils, each second gradient coil having a sweet spot in which the magnetic field generated is substantially linear, the sweet spots being coincident with the examination region;

the first and second primary coil sets being disposed in an overlapping relationship, the first primary coil set being at least one of axially and radially displaced relative to the second primary coil set such that the mutual inductance between the first and second primary coil sets is minimized; and at least one shielding coil set outside said first and second primary coil sets for generating a magnetic field to substantially zero magnetic field gradients outside of the shielding coil set.

19. The phased array gradient coil assembly according to claim 18, wherein the first primary coil set is a high-efficiency primary coil set that enhances the performance of ultra fast MR sequencing, and the second primary coil set is a low-efficiency primary coil set having a high-quality gradient field.

20. The phased array gradient coil assembly according to claim 18, wherein the first and second primary coil sets are mounted on a single primary former, the first primary coil set being mounted on an inside surface of the primary former and the second primary coil set being mounted on an outside surface of the primary former.

21. The phased array gradient coil assembly according to claim 18, wherein the first and second primary coil sets generate gradient magnetic fields across the examination region, which gradient magnetic fields have non-zero first derivatives in and adjacent the examination region.

22. A phased array gradient coil assembly for generating magnetic gradients across a main magnetic field of a magnetic resonance apparatus, the gradient coil assembly comprising:

a first primary coil set including first x, y, and z-gradient coils, each first gradient coil having geometric centers and sweet spots in which the magnetic field generated is substantially linear, the sweet spots being coincident with each other and an examination region, but not coincident with the respective geometric centers; and, a second primary coil set including second x, y, and z-gradient coils, each second gradient coil having geometric centers and sweet spots in which the magnetic field generated is substantially linear, the sweet spots being coincident with each other and the examination region, but not coincident with the respective geometric centers;

the first and second primary coil sets being disposed in an overlapping relationship, the first primary coil set being axially displaced relative to the second primary coil set.

23. In a magnetic resonance imaging apparatus having a main magnetic which generates a main magnetic field through and surrounding an examination region, first and second primary gradient coil sets disposed in an overlapping relationship adjacent the examination region, each of the first and second primary gradient coil sets having coils for generating magnetic field gradients along each of three orthogonal axes, an RF transmitter, receiver, and coil assembly positioned adjacent the examination region which excite magnetic resonance dipoles and receive corresponding magnetic resonance signals from the resonating dipoles, and a reconstruction processor which reconstructs the magnetic resonance signals into an image representation, a method of magnetic resonance imaging comprising:

applying a first gradient magnetic field across an examination region with the first primary gradient coil set during resonance excitation and spatial encoding;

applying second gradient magnetic fields across the examination region with the second primary gradient coil set during resonance data acquisition; and, reconstructing acquired resonance data into an image representation.

24. The magnetic resonance imaging method according to claim 23 wherein:
   the second coil has a faster gradient switching time than the first coil such that the second magnetic field gradients switch on and off faster than the first magnetic field gradient; and
   the first magnetic field is more linear than the second magnetic field gradients.

25. The magnetic resonance imaging method according to claim 24 wherein the first and second gradient magnetic fields are applied during an echo planar imaging sequence and the second magnetic field gradients include a series of read gradients.

26. The magnetic resonance imaging sequence according to claim 23 wherein:
   the first gradient coil applies first magnetic field gradients across a first portion of the examination region both during resonance excitation and resonance data acquisition; and,
   the second gradient coil applies second magnetic field gradients across a second portion of the examination region both during resonance excitation and resonance data acquisition, the first and second examination region portions being adjacent each other such that an enlarge area is imaged.

* * * * *

UNITED STATES PATENT AND TRADEMARK OFFICE
CERTIFICATE OF CORRECTION

PATENT NO. : 6,278,276 B1
DATED : August 21, 2001
INVENTOR(S) : Morich et al.

It is certified that error appears in the above-identified patent and that said Letters Patent is hereby corrected as shown below:

<u>Title page,</u>
Please correct the listing of the Inventors as follows:
-- [75] Inventors: Michael A. Morich, Mentor; Labros S. Petropoulos, Solon, both of OH (US) --

Signed and Sealed this

Fourteenth Day of May, 2002

*Attest:*

JAMES E. ROGAN
*Attesting Officer*  *Director of the United States Patent and Trademark Office*